(12) United States Patent
Bhalla et al.

(10) Patent No.: US 6,838,722 B2
(45) Date of Patent: Jan. 4, 2005

(54) STRUCTURES OF AND METHODS OF FABRICATING TRENCH-GATED MIS DEVICES

(75) Inventors: Anup Bhalla, Santa Clara, CA (US); Dorman Pitzer, San Jose, CA (US); Jacek Korec, San Jose, CA (US); Xiaorong Shi, San Jose, CA (US); Sik Lui, Sunnyvale, CA (US)

(73) Assignee: Siliconix Incorporated, Santa Clara, CA (US)

( * ) Notice: Subject to any disclaimer, the term of this patent is extended or adjusted under 35 U.S.C. 154(b) by 43 days.

(21) Appl. No.: 10/104,811

(22) Filed: Mar. 22, 2002

(65) Prior Publication Data

US 2003/0178673 A1 Sep. 25, 2003

(51) Int. Cl.$^7$ ............................................. H81L 27/108
(52) U.S. Cl. ...................... 257/301; 257/68; 257/301; 257/302; 257/303; 257/304; 257/305; 257/330; 257/331; 257/332; 257/333; 257/334; 257/905
(58) Field of Search ........................... 257/68, 301–305, 257/905, 330–334

(56) References Cited

U.S. PATENT DOCUMENTS

| | | | |
|---|---|---|---|
| 4,710,790 A | | 12/1987 | Okamoto et al. |
| 4,881,105 A | * | 11/1989 | Davari et al. ............... 257/334 |
| 5,614,751 A | * | 3/1997 | Yilmaz et al. ............... 257/394 |
| 5,726,463 A | | 3/1998 | Brown et al. |
| 5,763,915 A | | 6/1998 | Hshieh et al. ............... 257/330 |
| 5,877,528 A | | 3/1999 | So |
| 6,707,128 B2 | * | 3/2004 | Moriguchi et al. ......... 257/484 |

OTHER PUBLICATIONS

K. Imai et al., "Decrease in Trenched Surface Oxide Leakage Currents by Rounding Off Oxidation", Extended Abstracts of the 18$^{th}$ (1986 International) Conference on Solid State Devices and Materials, Tokyo 1986, pp 303–306.
Y. Baba et al., "High Reliable UMOSFET with Oxide–Nitride Complex Gate Structure" 1997 IEEE, pp. 369–372.

* cited by examiner

*Primary Examiner*—George Eckert
*Assistant Examiner*—Edgardo Ortiz
(74) *Attorney, Agent, or Firm*—Wagner, Murabito & Hao LLP

(57) ABSTRACT

In a trench-gated MIS device contact is made to the gate within the trench, thereby eliminating the need to have the gate material, typically polysilicon, extend outside of the trench. This avoids the problem of stress at the upper corners of the trench. Contact between the gate metal and the polysilicon is normally made in a gate metal region that is outside the active region of the device. Various configurations for making the contact between the gate metal and the polysilicon are described, including embodiments wherein the trench is widened in the area of contact. Since the polysilicon is etched back below the top surface of the silicon throughout the device, there is normally no need for a polysilicon mask, thereby saving fabrication costs.

7 Claims, 73 Drawing Sheets

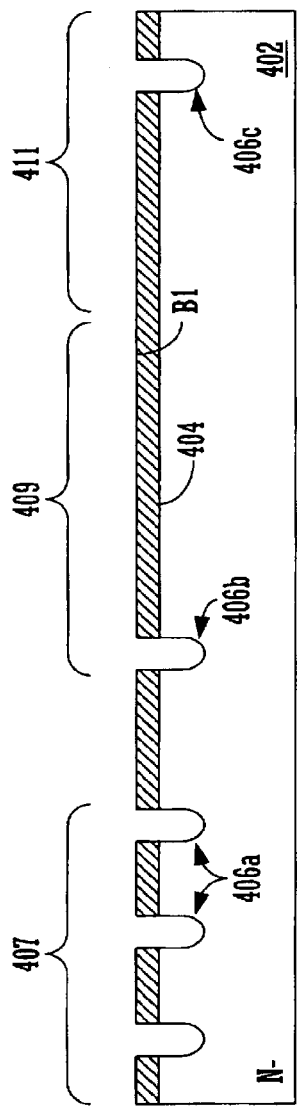
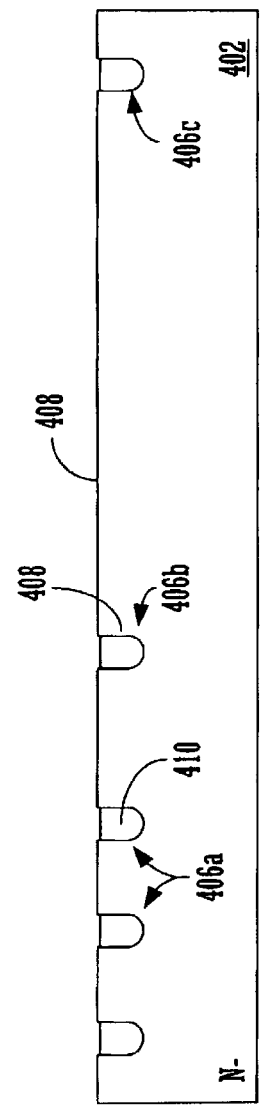
FIGURE 21A
FIGURE 21B

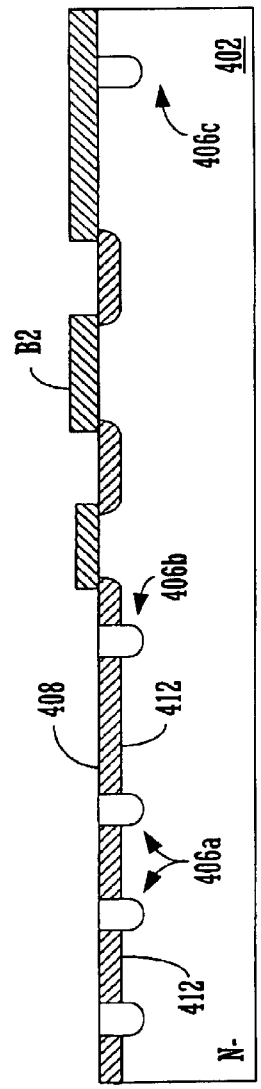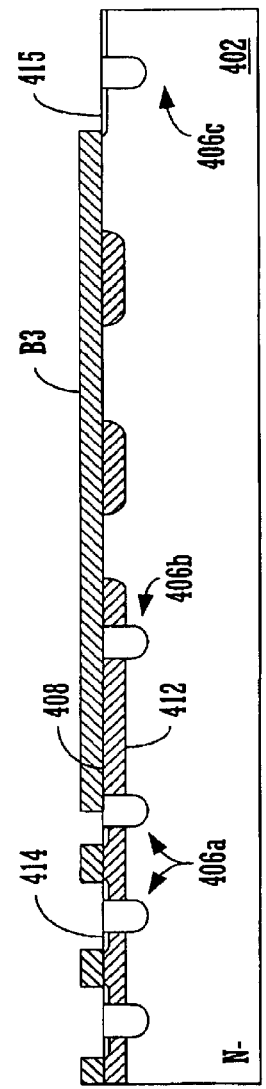
FIGURE 21C
FIGURE 21D

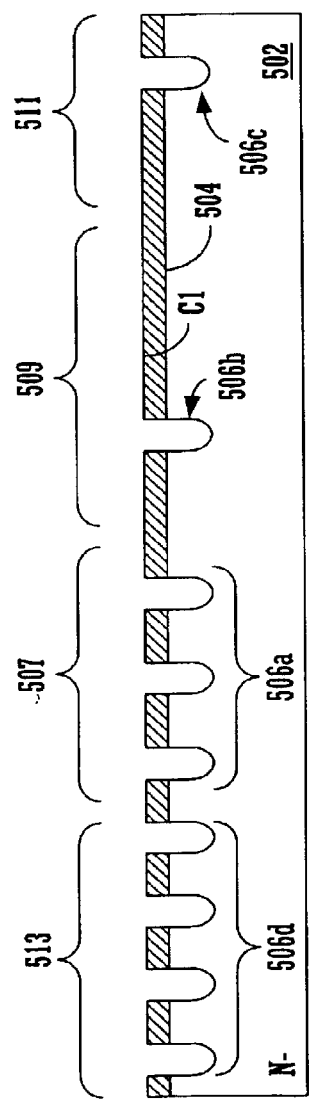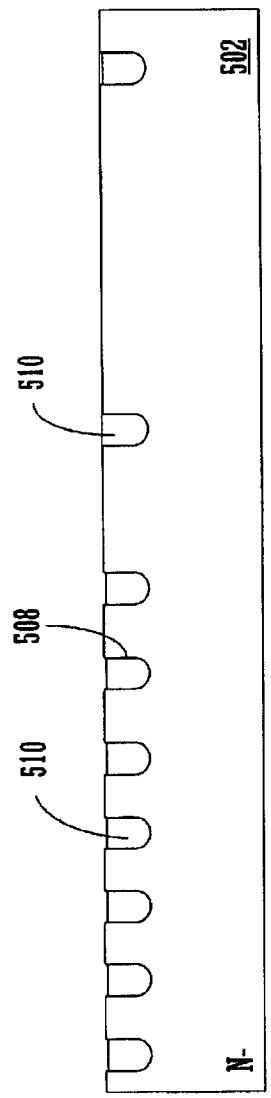
FIGURE 22A
FIGURE 22B

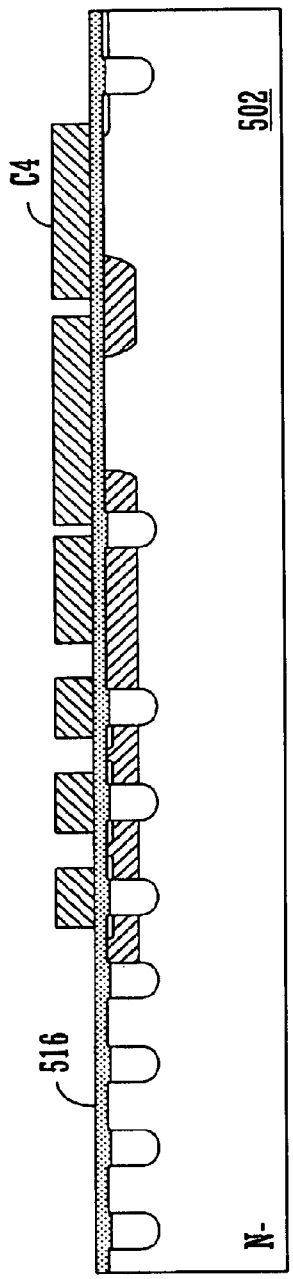
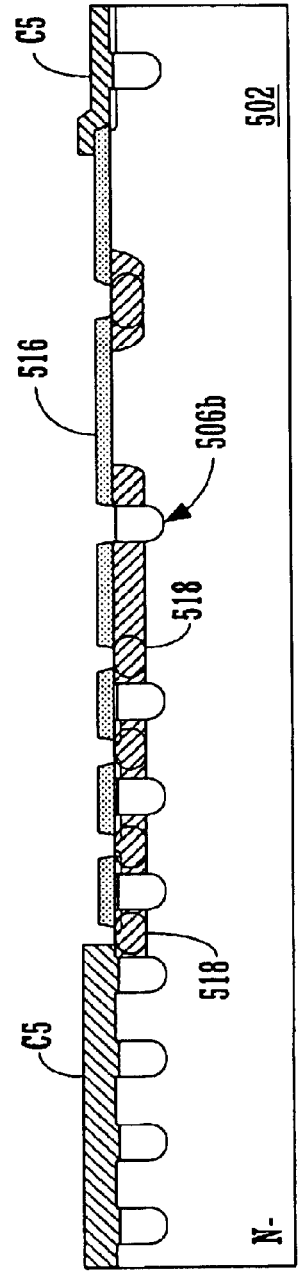

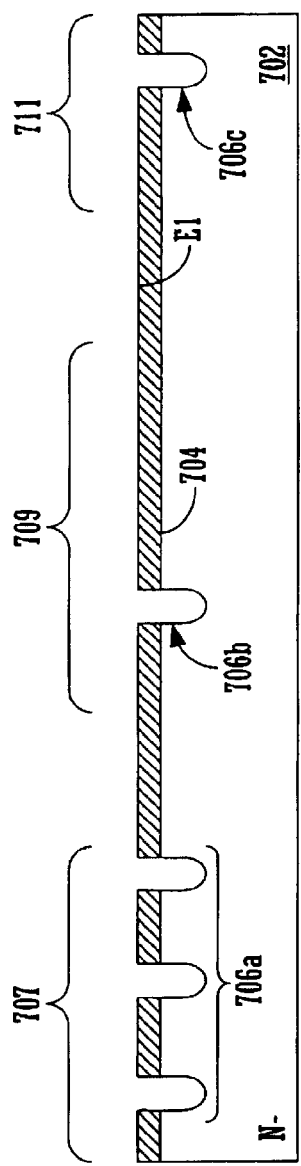
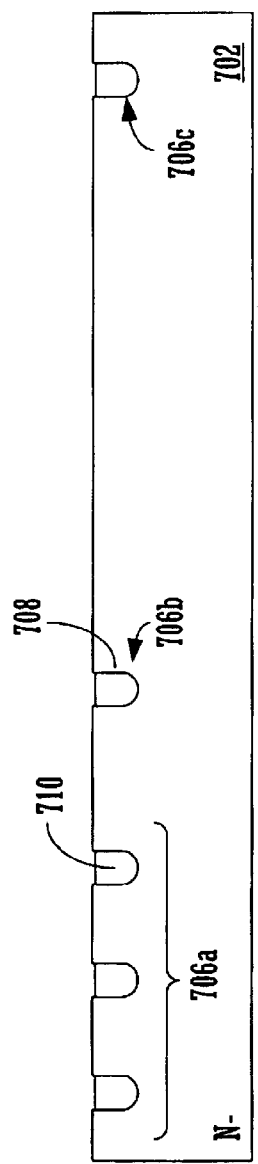
FIGURE 24A
FIGURE 24B

STRUCTURES OF AND METHODS OF FABRICATING TRENCH-GATED MIS DEVICES

FIELD OF THE INVENTION

This invention relates to metal-insulator-silicon semiconductor devices and in particular to such devices in which the gate is formed in a trench.

BACKGROUND OF THE INVENTION

There is a class of metal-insulator-silicon (MIS) devices in which the gate is formed in a trench that extends downward from the surface of the silicon or other semiconductor material. The current flow in such devices is primarily vertical and as a result the cells can be more densely packed. All else being equal, this increases the current carrying capability and reduces the on-resistance of the device. Devices that fit into the general catagory of MIS devices include metal-oxide-silicon field-effect transistors (MOSFETs), insulated gate bipolar transistors (IGBTs) and MOS-gated thyristors. Cross-sectional views of a single gate trench in a MOSFET, an IGBT and a MOS-gated thyristor are shown in FIGS. 1, 2 and 3, respectively.

In such devices the gate material, often polysilicon, must be connected to the leads of the device package and to external circuitry by means of a conductive pad, typically metal. To accomplish this, the trench is filled to overflowing with the gate material and the gate material is patterned using lithography and etching. Following the patterning, the gate material normally is restricted to the inside of the trench in the active areas of the device, as shown in FIGS. 1, 2 and 3. In the areas where the contact is to be made to the gate material, however, the gate material extends outside of the trench and overlies the surface of the silicon. This is shown in the three-dimensional cutaway view of a conventional MIS device 40 in FIG. 4, wherein in an inactive gate metal area 41 a polysilicon layer 42 extends outside the trenches 44 and overlies the epitaxial silicon layer 46. Trenches 44 are lined with a gate oxide layer 47 which insulates the polysilicon layer 42 from the epitaxial layer 46. The ends of the trenches are designated 43. A portion of the polysilicon layer 42 overlies a thick field oxide region 48. The area of contact between a subsequent gate metal layer and polysilicon layer 42 is designated 45.

FIG. 5A is a top view of the gate metal area 41 of the same device. FIG. 5B is a cross-sectional view of the same device taken at cross-section 5B–5B (drawn to a different scale from FIG. 5A). In this embodiment the MIS cells 54 in the active area 56 are square. Polysilicon layer 42 and the area of contact 45 between gate metal 49 and polysilicon layer 42 are shown. FIG. 6 is a similar top view taken in the gate pad edge and termination region of the device.

The corners of the trenches are known to be sources of stress, leading to defect-related problems in devices. This is shown in FIG. 7, which is a detailed cross-sectional view taken near the end of one of trenches 44. The upper trench corners, represented by 52, typically oxidize in a manner that leads to local thinning of the oxide and a lower breakdown voltage across the oxide. The sharper the corner, the more serious this problem becomes. Moreover, when a voltage difference is applied between the gate and the adjacent semiconductor material (P-body in FIG. 7, which in a MOSFET is normally shorted to the source), the electric field reaches a maximum at the trench corners as a result of field crowding. This leads to leakage currents from Fowler-Nordheim tunneling through the gate oxide and limits the maximum usable gate voltage of the device. The field-crowding problem is present even if the gate oxide layer is perfectly uniform, and it becomes worse as the trench corner becomes sharper.

For these reasons, many manufacturers use various techniques for rounding the trench corners. It is difficult, however, to round the upper trench corners sufficiently to avoid the problem of an excessive gate leakage current, and it is likely to become more difficult to do so as cell densities increase.

Furthermore, the process used to fabricate trench-gated MOSFETs normally involves many mask steps and yields an uneven topography that hinders the definition of very small features. FIGS. 8A–8I illustrate the steps of a conventional process performed on an N+ silicon substrate 802. The process begins with a first photoresist mask A1 which is formed over an oxide layer 804 and patterned, using normal photolithographic processes, to define the areas where P-tubs will be formed (FIG. 8A). The P-tubs are used to reduce the strength of the electric field at the corners of the trenches. P-type dopant is implant through openings in mask A1 to form P-tubs 806, and mask A1 is removed. After P-tubs 806 are driven in by heating, which thickens oxide layer 804 (FIG. 8B), a second mask A2 is deposited and patterned to define the active region 808 of the device, the oxide layer 804, which has become a field oxide layer, remaining in a termination region 810 of the device (FIG. 8C).

Mask A2 is removed, and a third, trench mask A3 is formed and patterned to define where the trenches will be located. Trenches 812 are then etched, typically using a reactive ion etch (RIE) process (FIG. 8D). Trenches 812A and 812B are interconnected (in the third dimension outside the plane of the paper) and trench 812C is an optional "channel stopper" trench which is located on the outer edge of the termination area. After the trenches have been etched and mask A3 has been removed, a sacrificial oxide layer is formed and removed to repair any crystal damage that occurred during the RIE process. A gate oxide layer 813 is formed on the walls of the trenches 812.

A polysilicon layer 814 is deposited and doped, filling trenches 812 and overflowing onto the surface of the silicon. A fourth, polysilicon mask A4 is deposited on polysilicon layer 814 and patterned (FIG. 8E). Polysilicon layer 814 is etched back into the trenches 812, except for a portion that is allowed to extend from trench 812B onto the field oxide layer 804 in the gate bus area. It is through this extension of the polysilicon layer 814 that electrical contact with the portion of polysilicon layer 814 in the trenches 812 is made.

Mask A4 is then removed, and P-type dopant is implanted and driven in to form P-body regions 816 (FIG. 8F). While this dopant also gets into the polysilicon layer 814, its concentration is too low to create any problems there.

A fifth mask A5 is deposited and patterned to define areas where N-type dopant is to be implanted to form N+ source regions 818 (FIG. 8G). After N+ source regions 818 have been formed and mask A5 has been removed, a borophosphosilicate glass (BPSG) layer 820 is deposited and reflowed. A sixth mask A6 is formed and patterned to define where contact to the substrate (P-body regions 816 and N+ source regions 818) and to the gate (polysilicon layer 814) is to be made (FIG. 8H). P-type dopant is implanted to form P+ body contact regions 821 and then a metal layer 822 is deposited. A seventh mask (not shown) is formed over metal layer 822 and patterned. Metal layer 822 is etched through the seventh mask to form a source metal 822A and a gate bus 822B (FIG. 8I). Optionally, a passivation layer is deposited, and if so an eighth mask (not shown) is formed and patterned to define the source and gate pads, where external contact to the MOSFET will be made.

There are several disadvantages with this process. First, eight masks are required and this leads to considerable complexity and expense. Second, the presence of the field oxide layer 804 and the extension of the polysilicon layer 814 outside the trenches yields a raised topography in the area of the gate bus 822B. This raised area creates problems in photolithography, particularly as the dimensions of these devices extend further into the submicron range. Third, breakdown may occur across the gate oxide at the upper corners of trench 812B polysilicon layer 814 and substrate 802.

Therefore, what is needed is a process that is simpler, yields a flatter topography and avoids the breakdown problem at the upper corners of the trenches.

SUMMARY OF THE INVENTION

This invention provides a structure and technique for avoiding the problem of voltage breakdown at the upper corners of the trenches in a trench-gated MIS device. A trench-gated MIS device is formed in a semiconductor chip which comprises an active area containing transistor cells, a gate metal area containing no transistor cells; and a gate metal layer. A trench is formed in a pattern on a surface of the semiconductor chip, the trench extending from the active area into the gate metal area, the trench having walls lined with a layer of an insulating material. A conductive gate material, normally polysilicon, is disposed in the trench, a top surface of the gate material being at a level lower than a top surface of the semiconductor chip. A nonconductive layer overlies the active and gate metal areas, and an aperture is formed in the nonconductive layer over a portion of the trench in the gate metal area. The aperture is filled with a conductive material, often referred to as a "gate metal", such that the gate metal contacts the conductive gate material in an area of contact that is within the trench.

Since the gate material does not overflow the trench onto the surface of the semiconductor chip, the gate material does not extend around the upper corners of the trench. This avoids the stress that occurs when a voltage difference is created between the gate material and the semiconductor material.

Numerous embodiments according to this invention are possible. For example, to create a good electrical contact between the gate material and the gate metal, a width of the trench at the area of contact between the gate contact material and the gate material may be greater than a width of the trench in the active area. The gate metal may contact the conductive gate material in a first gate finger, the first gate finger being perpendicular to a second gate finger, the second gate finger extending from the active area into the gate metal area and intersecting the first gate finger.

Another aspect of this invention relates to a process of fabricating an MIS device. The process requires fewer masking steps than conventional processes and yields a device with a relatively flat topography which is more amenable to very fine photolithographic processing. The process comprises forming a trench mask over the surface of a semiconductor substrate, the trench mask having an aperture defining the location of a trench; etching through the aperture in the trench mask to form a trench in the substrate; removing the trench mask; forming a first nonconductive layer on a wall of the trench; depositing a layer of a conductive gate material such that the gate material overflows onto the surface of the substrate outside the trench; etching the gate material without a mask such that a top surface of the gate material is reduced to a level below the surface of the substrate; depositing a second nonconductive layer over the surface of the substrate, forming a contact mask over the second nonconductive layer, the contact mask having an aperture; etching through the aperture in the contact mask to form a gate contact aperture in the second nonconductive layer; removing the contact mask; and depositing a second conductive layer over the second nonconductive layer, the second conductive layer extending through the gate contact aperture to make contact with the gate material. Optionally, etching through the contact mask may form a substrate contact aperture in the second nonconductive layer, and the second conductive layer may extend through the substrate contact aperture to make contact with the substrate, and the process may include forming a metal mask over the second conductive layer, the metal mask having an aperture; and etching the second conductive layer through the aperture in the metal mask. The process does not include a mask for etching a portion of the gate contact material and may not include a mask for etching a portion of an oxide layer to form a field oxide region.

Many variations of the process are possible, and the process can be used to fabricate a variety of MIS devices, including MOSFETS, IGBTs, MOS-gated thyristors. The process can also be used to fabricate a MOSFET with integrated Schottky or polysilicon diodes.

The invention also includes an MIS device having a relatively flat topography. In particular, the gate bus does not overlie a thick field oxide region. Rather, a nonconductive layer (e.g., BPSG) overlies the top surface of the semiconductor substrate. A conductive layer, typically metal, overlies the nonconductive layer. The nonconductive layer contains apertures through which the metal layer makes electrical contact with the substrate in the active region of the MIS device (e.g., the source and body in a MOSFET). A gate bus also overlies the same nonconductive layer. The thickness of the nonconductive layer under the gate bus is substantially the same as the thickness of the nonconductive layer in the active region of the device. In some embodiments, a gate contact trench filled with a conductive gate material is formed in the substrate below the gate bus, and the gate bus is electrically connected to the gate material through an aperture in the nonconductive layer.

In accordance with another aspect of the invention, two or more protective trenches are formed on the opposite sides of the gate contact trench. This allows the gate contact trench to be made wider and deeper than the trenches in the active region of the device without adversely affecting the breakdown voltage at the bottom of the gate contact trench.

BRIEF DESCRIPTION OF THE DRAWINGS

FIGS. 21A–21I illustrate the steps of a process in accordance with the invention for fabricating a trench MOSFET.

FIGS. 22A–22I illustrate the steps of a process for forming a trench MOSFET with an integrated Schottky diode.

FIGS. 24A–24I illustrate the steps of a process in accordance with the invention for forming a trench MOSFET with integrated polysilicon diodes.

DESCRIPTION OF THE INVENTION

According to this invention, the polysilicon or other material used to fill the trenches in a trench-gated MIS device is etched back or otherwise held back within the trench such that contact between the gate filling material and the gate metal is made within the trench. The gate filling material does not overlap the upper corners of the trench, thereby eliminating the problems that arise from the stress at the upper corners of the trench. (Note: As used herein, "polysilicon" designates whatever conductive material is deposited in the trench as a gate material, it being understood that in some embodiments metal or other conductive materials may be used instead of polysilicon as the gate material; similarly, "gate metal" is used to designate the conductive material that is used to form a contact with the gate material within the trench, it being understood that in some embodiments polysilicon or other conductive materials may be used instead of metal as the "gate metal".)

Figure 9:
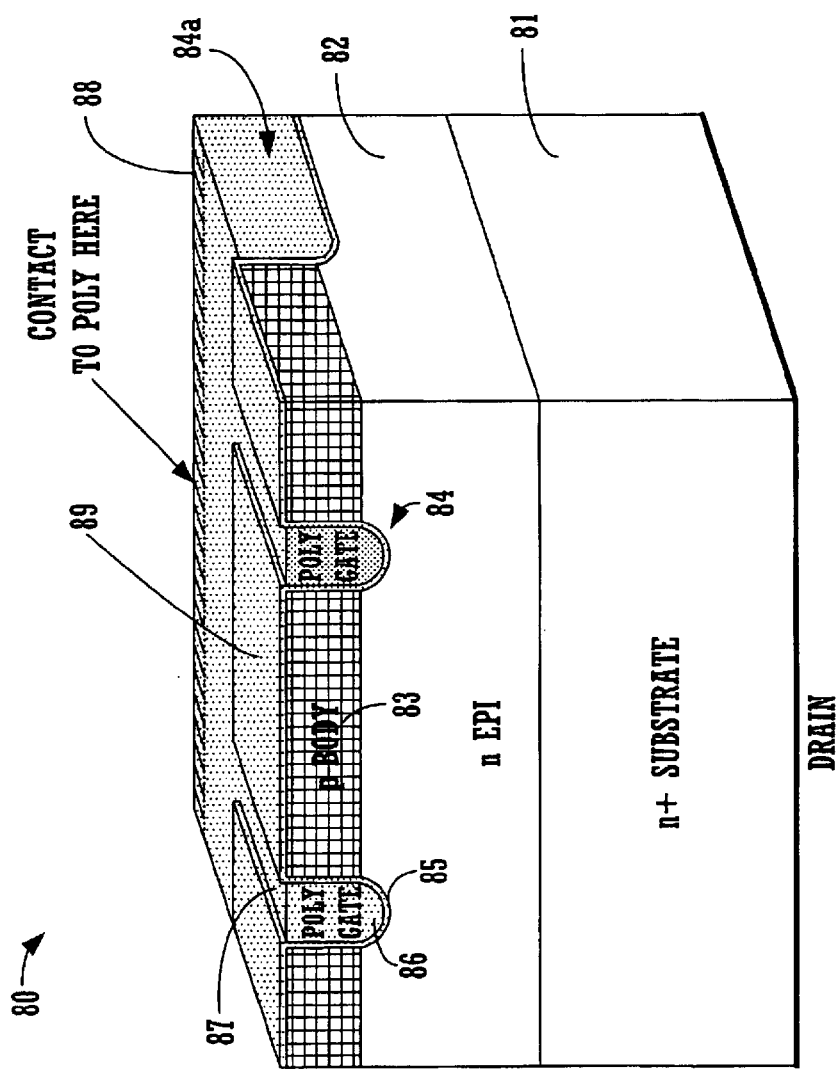
FIG. 9 is a three-dimensional cutaway view of an MIS device in accordance with the invention.

FIG. 9 shows a partial view of a trench-gated MIS device 80 formed in an N-epitaxial (epi) layer 82 which is grown on an N+ substrate 81. A P-body region 83 is shown in N-epi layer 82. A gate trench 84 is lined by a gate oxide layer 85 which connects with an oxide layer 89 on the top surface of N-epi layer 82. Trench 84 is partially filled with a polysilicon gate 86 having a top surface 87 which is within trench 84 (i.e., below the top surface of N-epi layer 82). In this embodiment trench 84 includes a somewhat wider transverse portion 84A. A portion 88 of the top surface 87 in transverse portion 84A indicates where contact will later be made between polysilicon gate 86 and a gate metal layer (not shown).

Figure 2:
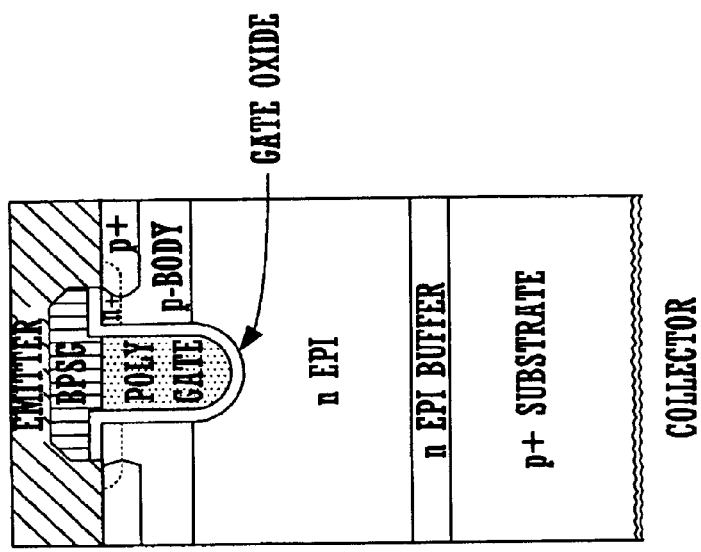
FIG. 2 is a cross-sectional view of a single gate trench in an IGBT.
Figure 1:
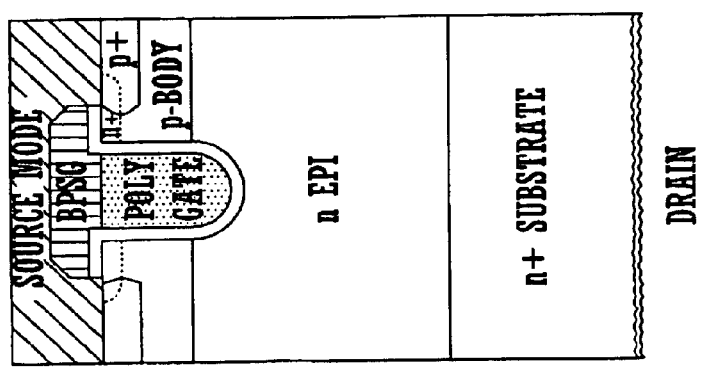
FIG. 1 is a cross-sectional view of a single gate trench in a MOSFET.
Figure 3:
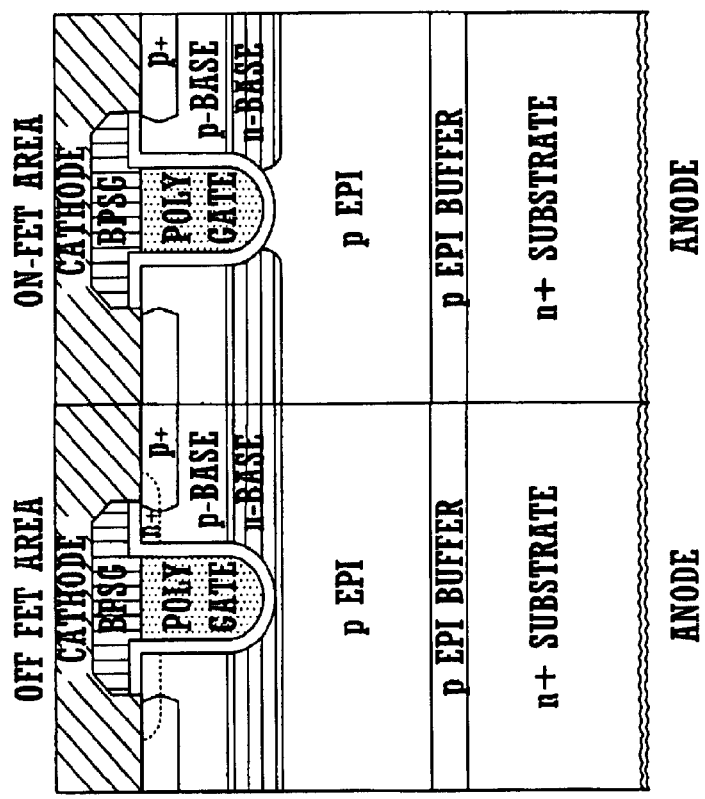
FIG. 3 is a cross-sectional view of a single gate trench in a MOS-gated thyristor.
Figure 4:
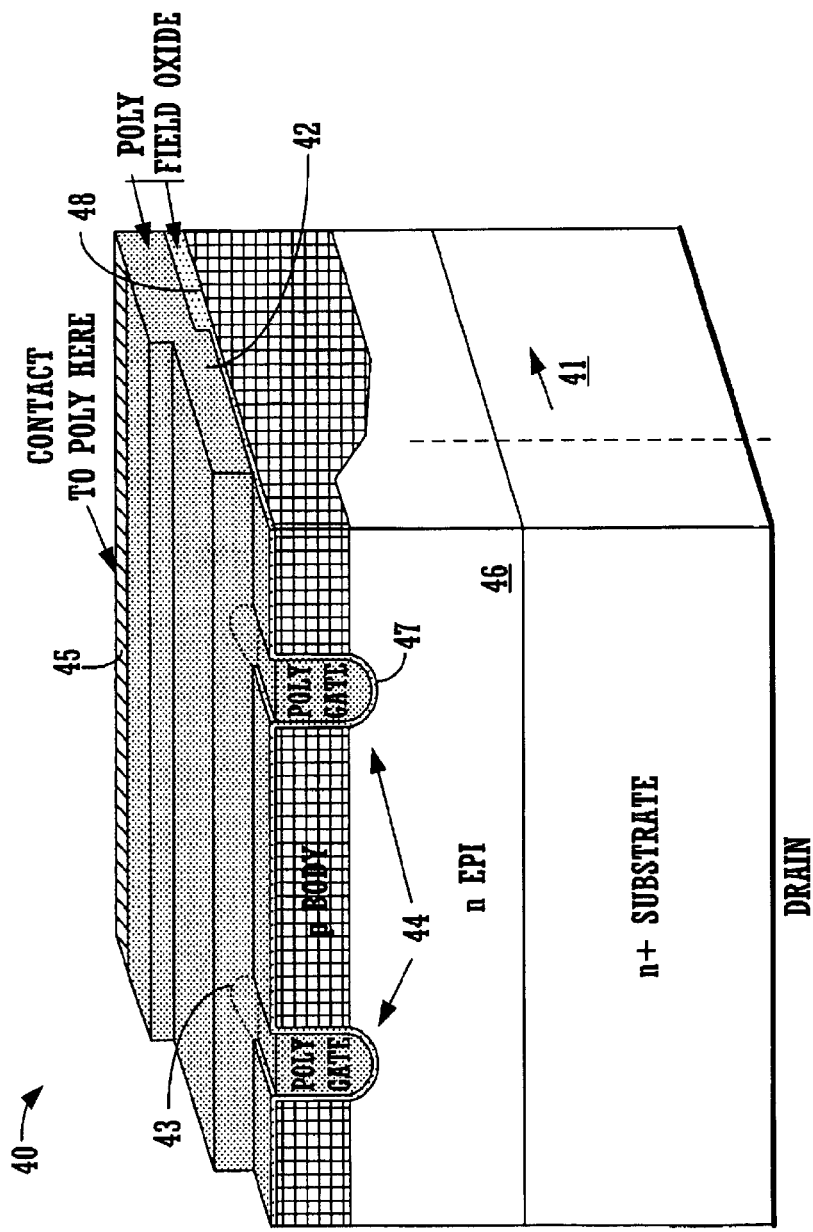
FIG. 4 is a three-dimensional cutaway view showing how the gate is contacted in a conventional MIS device.
Figure 5A:
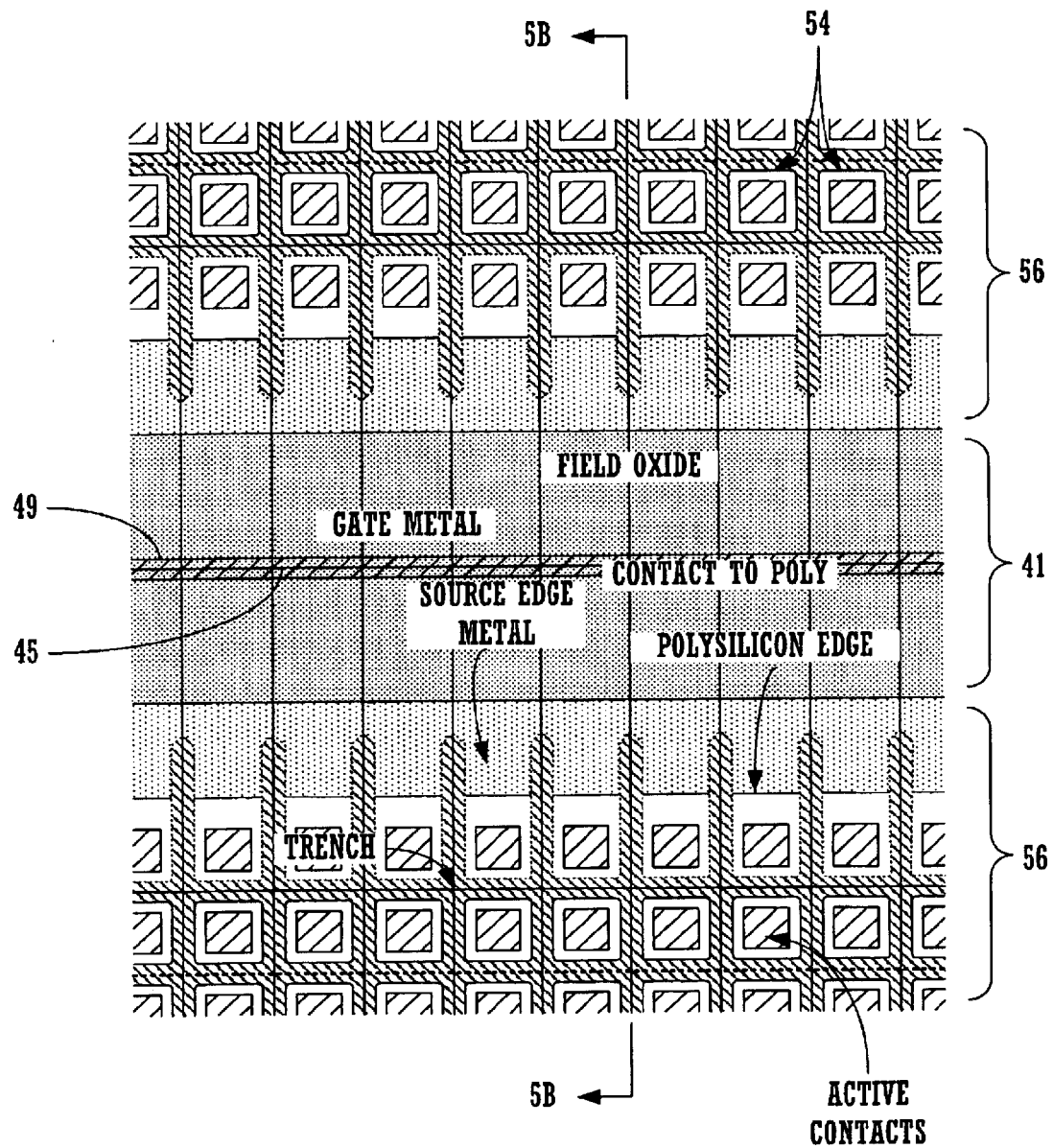
FIG. 5A is a top view and FIG. 5B is a cross-sectional view of the gate metal area of the MIS device shown in FIG. 4.
Figure 5B:
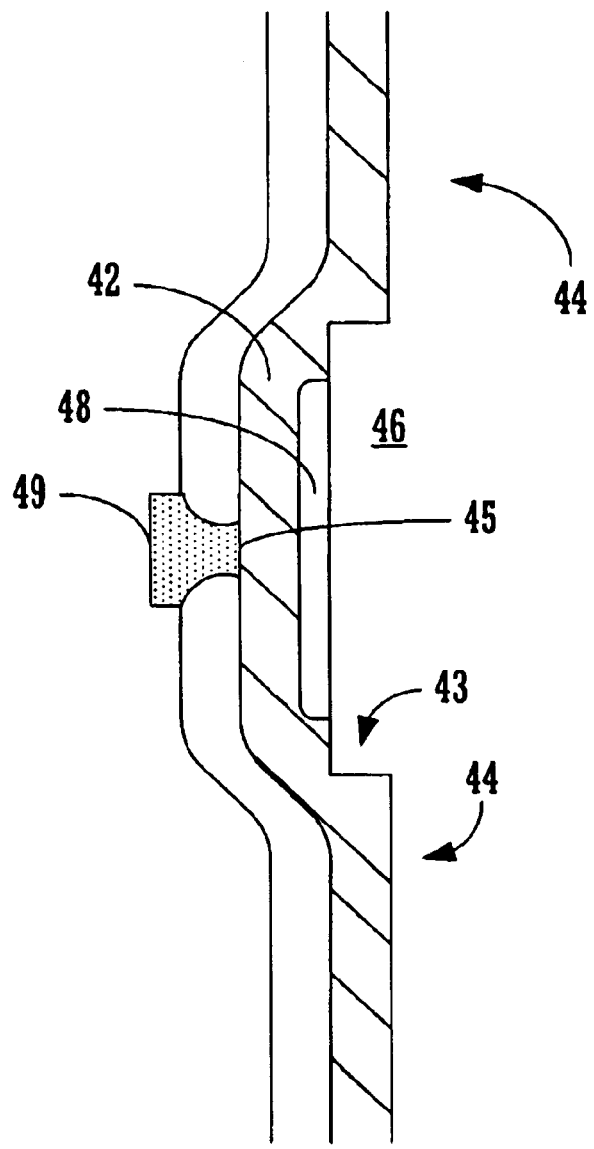
Figure 6:
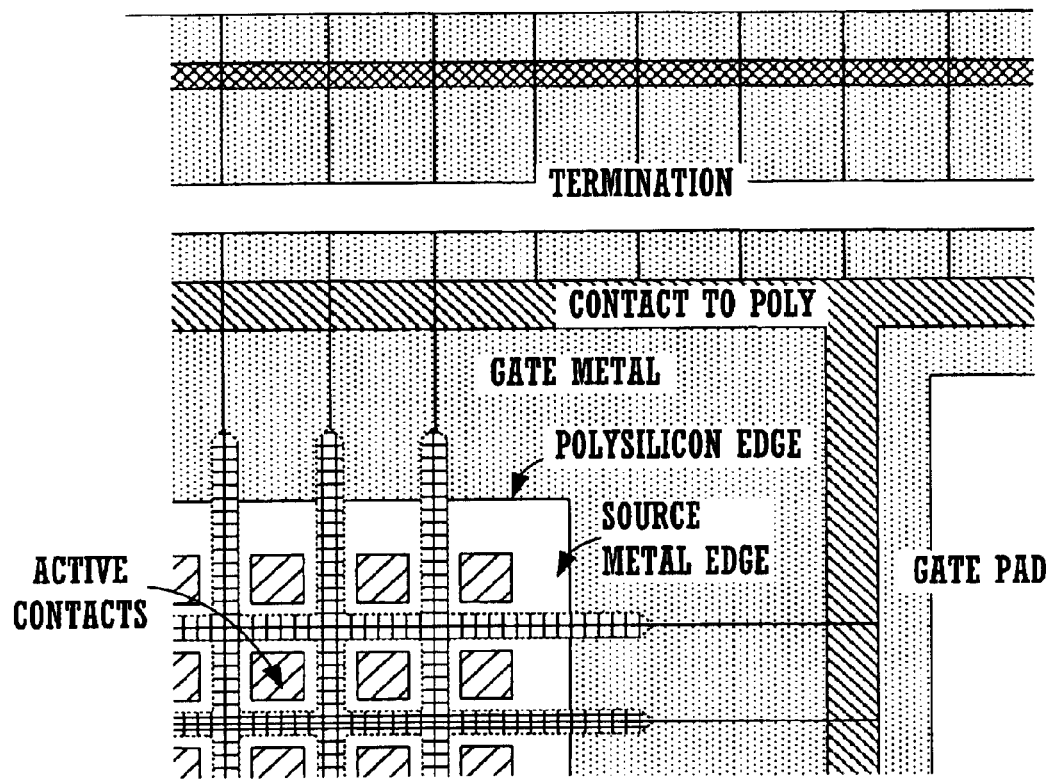
FIG. 6 is a top view taken in the gate pad edge and termination region of the MIS device.
Figure 7:
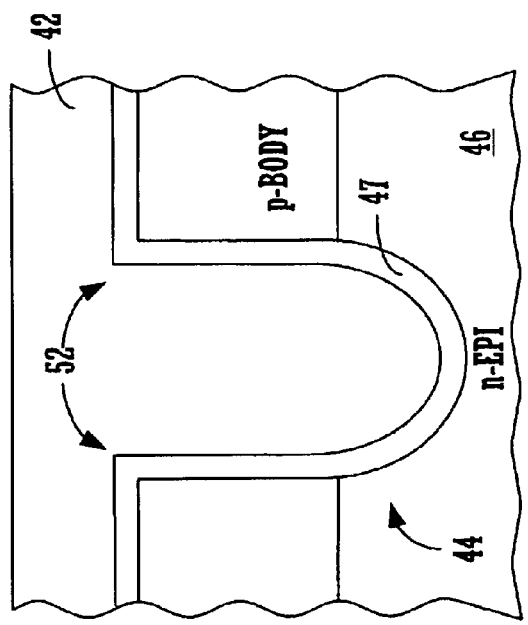
FIG. 7 is a detailed view of a gate trench, showing the areas of stress at the upper corners of the trench.
Figure 8A:
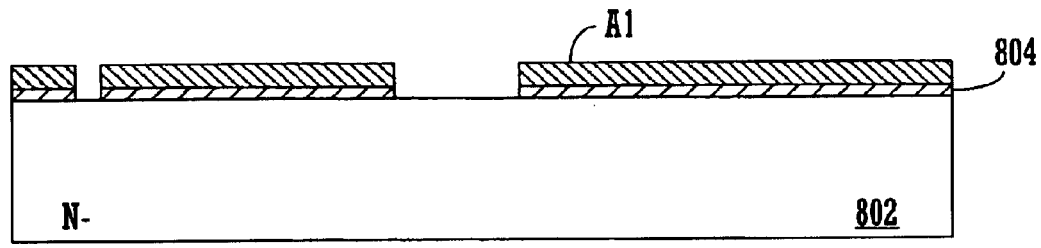
FIGS. 8A–8I show the steps of a conventional process for forming a trench-gated MOSFET.
Figure 8B:
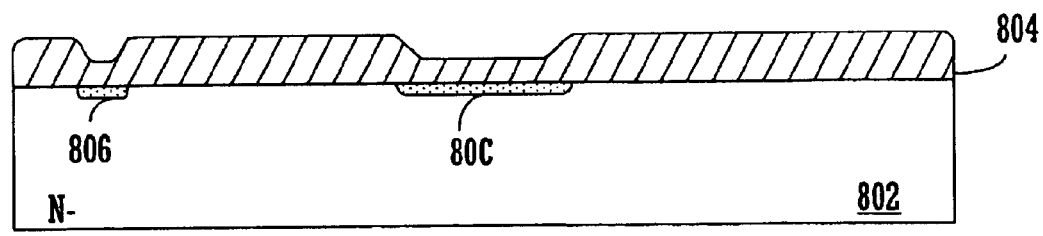
Figure 8C:
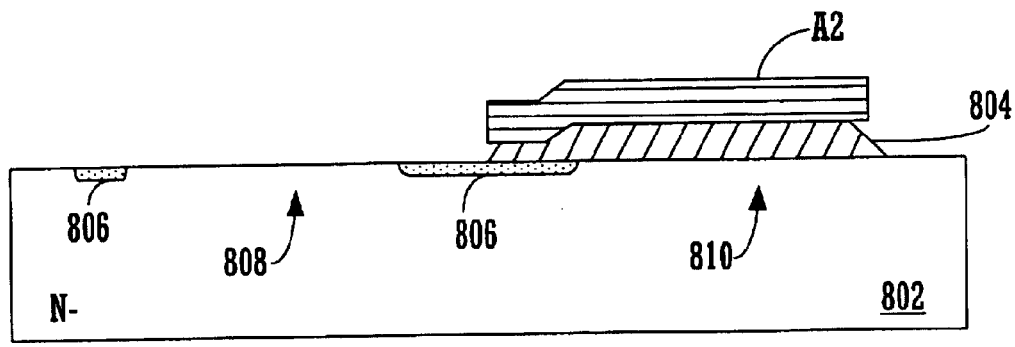
Figure 8D:
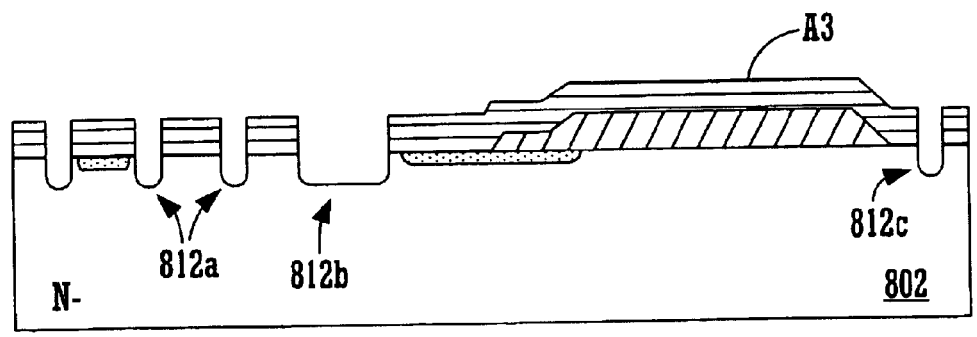
Figure 8E:
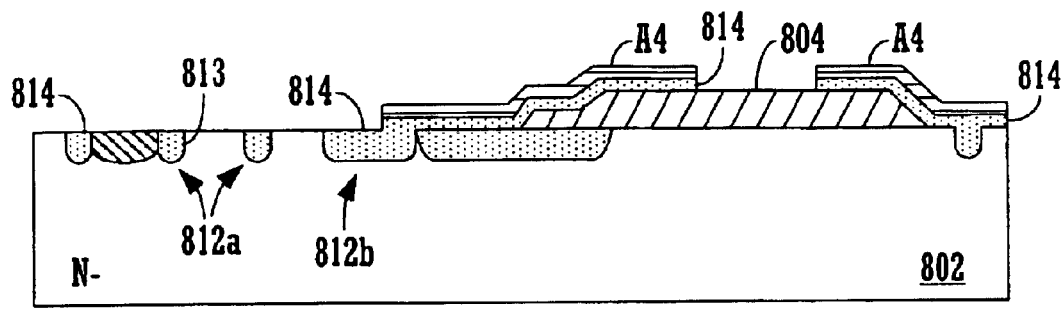
Figure 8F:
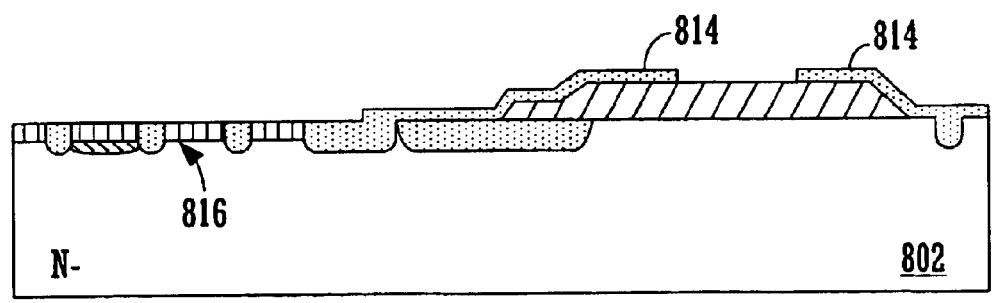
Figure 8G:
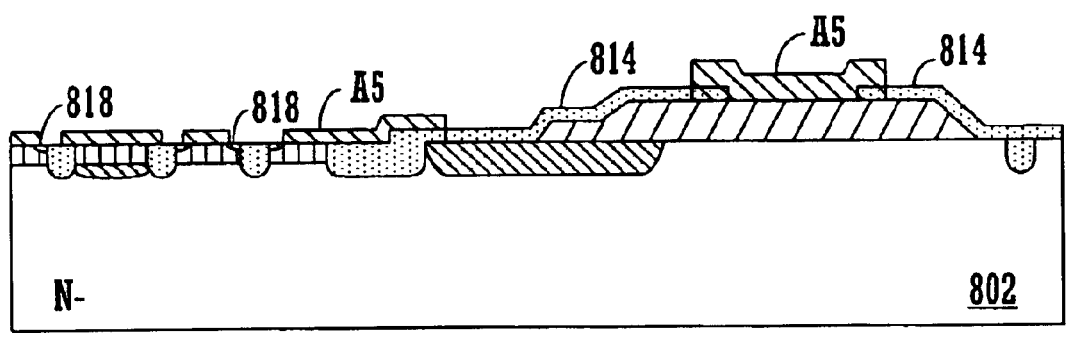
Figure 8H:
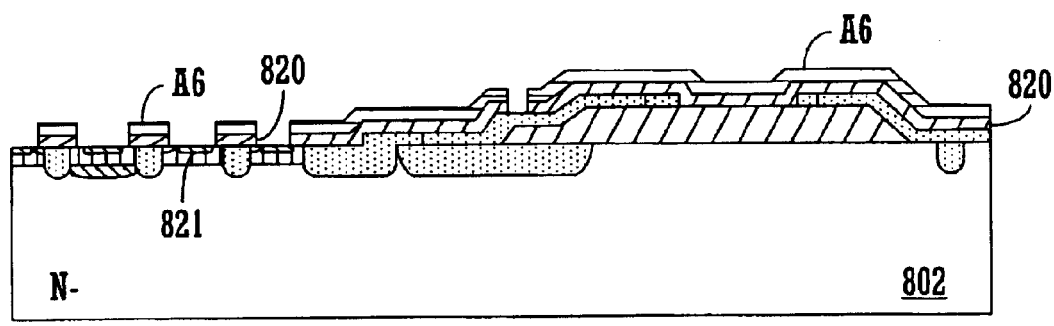
Figure 8I:
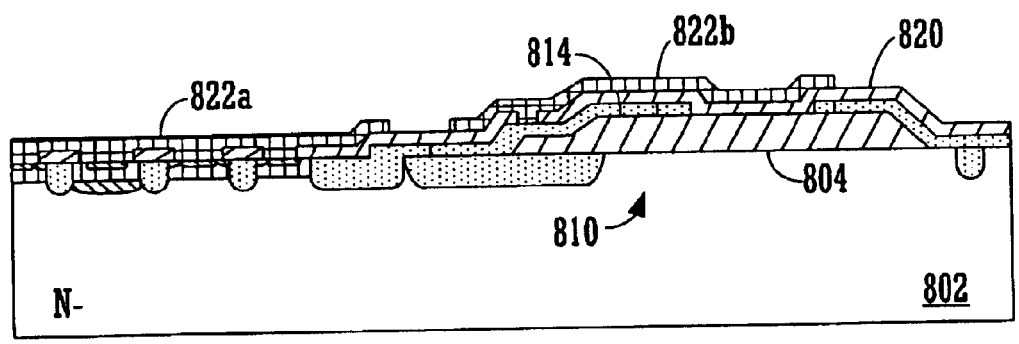

In contrast with the similar MIS device 40 shown in FIG. 4, the polysilicon within trench 84 does not extend around the upper corners of the trench in the manner of polysilicon layer 42. This avoids the stress problems described above.

Figure 10:
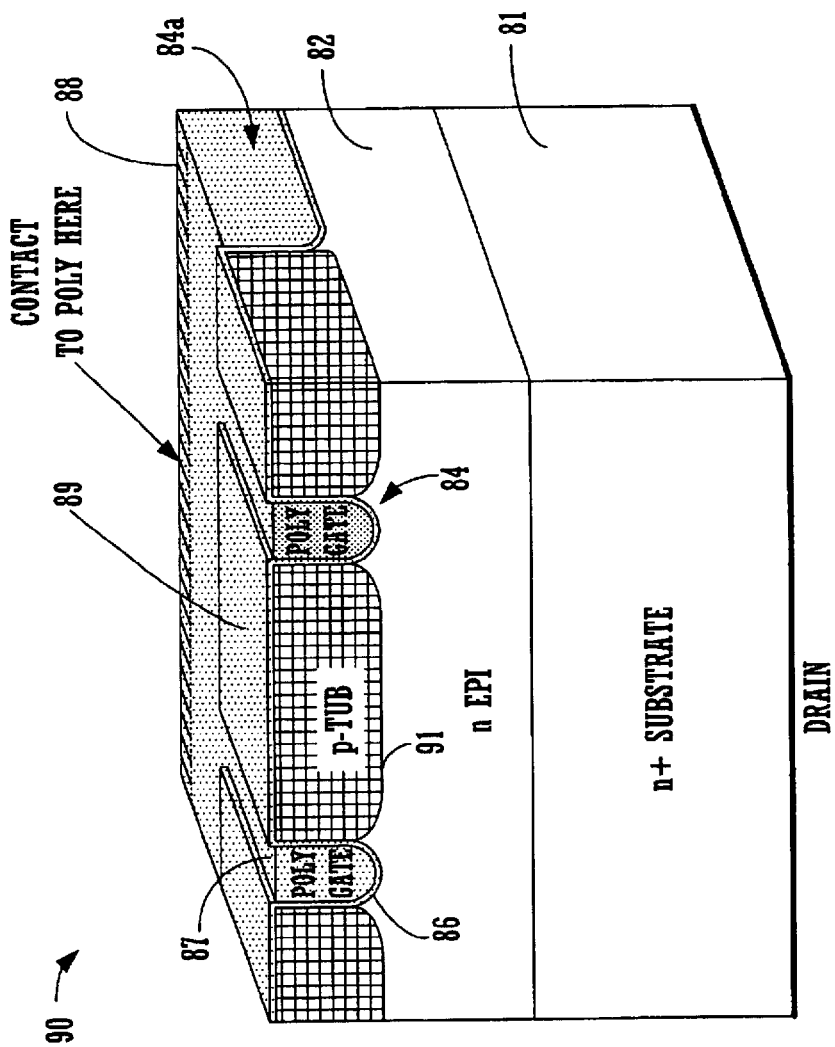
FIG. 10 is a three-dimensional cutaway view of an MIS device in accordance with the invention which contains a P-tub in the mesas.
Figure 11:
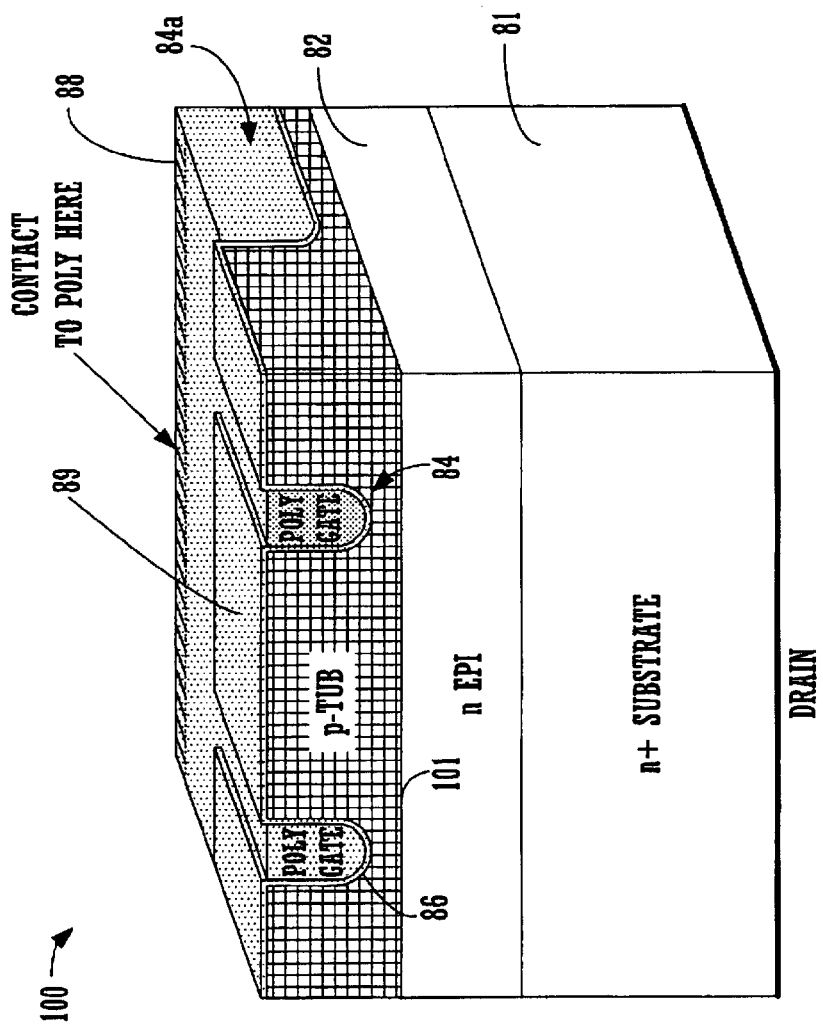
FIG. 11 is a three-dimensional cutaway view of an MIS device in accordance with the invention which contains a P-tub which extends underneath the trench.

FIG. 10 shows an MIS device 90 which is similar to MIS device 80 except that a P-tub 91 is formed in N-epi layer 82 in the mesa between the trench segments to shield the gate trench 84. In the MIS device 100 shown in FIG. 11, P-tub 101 extends into the area directly below the trench 84. MIS devices 90 and 100 are designed to have high breakdown voltages.

Figure 12:
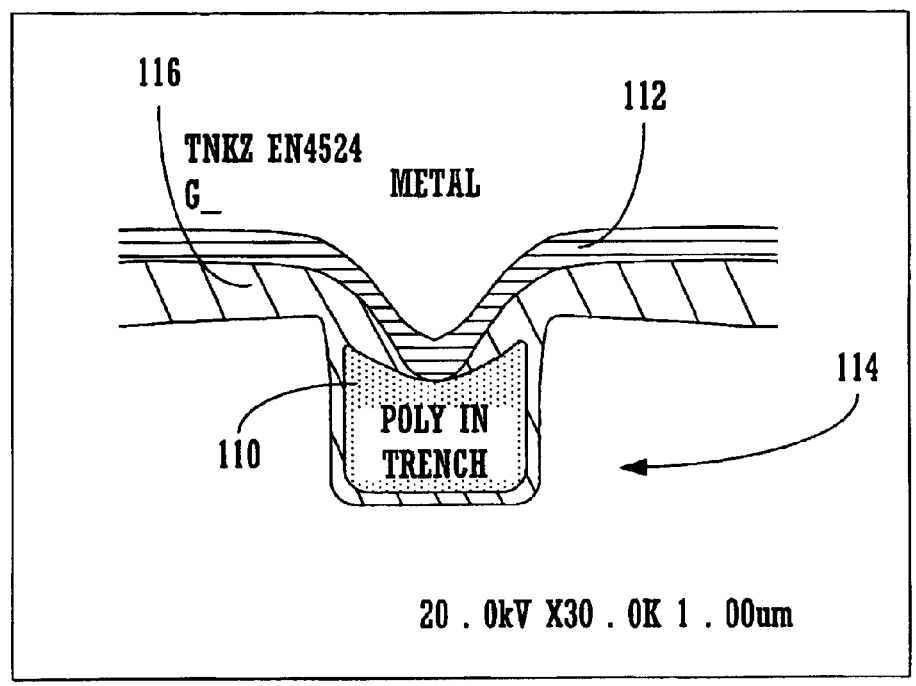
FIG. 12 is a cross-sectional view made by a scanning electron microscope (SEM) a MOS capacitor fabricated in accordance with this invention.

FIG. 12 is a cross-sectional view made by a scanning electron microscope (SEM) of a MOS capacitor fabricated in accordance with this invention. The polysilicon gate is shown as 110 and the gate metal as 112. A BPSG dielectric layer 116 overlies the mesas between the segments of trench 114 and provides insulation between the gate metal 112 and the upper corners of trench 114.

Figure 13:
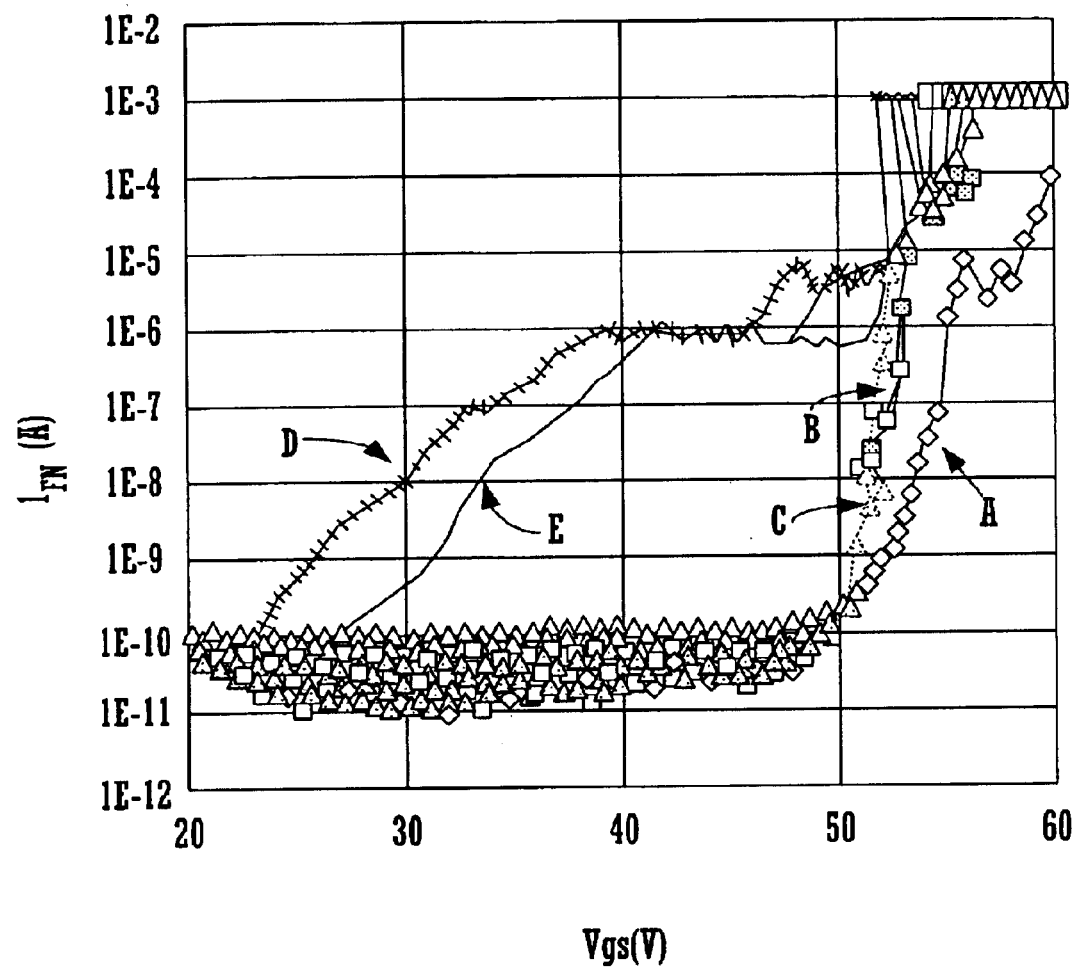
FIG. 13 is a graph showing the Fowler-Nordheim tunneling current as a function of the voltage between the gate and the silicon for various types of MOS capacitors.

FIG. 13 is a graph showing the Fowler-Nordheim tunneling current as a function of the voltage between the gate and the silicon for various types of MOS capacitors. Curves A–E are for the following devices:

TABLE 1

| Curve | Type of Device |
| --- | --- |
| A | Conventional Planar Device |
| B | Device According to Invention with Square Cells |
| C | Device According to Invention with Stripe Cells |
| D | Conventional Device with Square Cells |
| E | Conventional Device with Stripe Cells |

According to FIG. 13, in the range from about 25V to 50V the FN tunneling currents are much lower for devices according to the invention than for conventional trench-gated devices and in fact they are quite similar to the currents for conventional planar devices.

Figure 14:
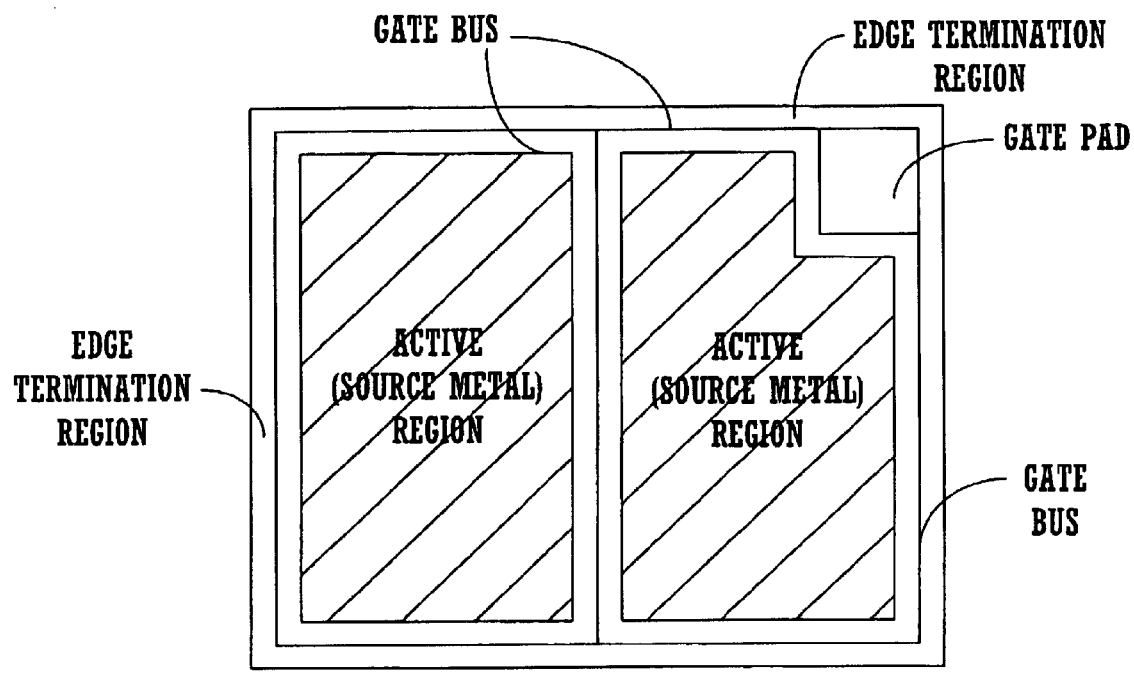
FIG. 14 is an overall top view of an MIS chip showing how the active regions, the gate pad regions, the termination regions, and the gate metal regions might be configured.

The principles of this invention can be applied to a wide variety of cofigurations. Several examples, by no means exhaustive, are shown in FIGS. 15A–15C, 16A–16F, 17A, 17B, 18 and 19. All of these examples show a series of parallel "gate fingers" which leave the the active area of an MIS device and enter a gate metal region of a termination or gate pad region. As used herein, the term "gate finger" refers to an extension of the gate trench into a region outside the active region of the MIS device, e.g., sometimes referred to as the "gate metal" or "gate bus" region or the "termination" or "edge termination" region. FIG. 14 is an overall top view of an MIS chip showing illustratively how the active, gate pad and the edge termination regions might be configured. It will be appreciated by those skilled in the art that numerous alternative configurations are possible.

Figure 15A:
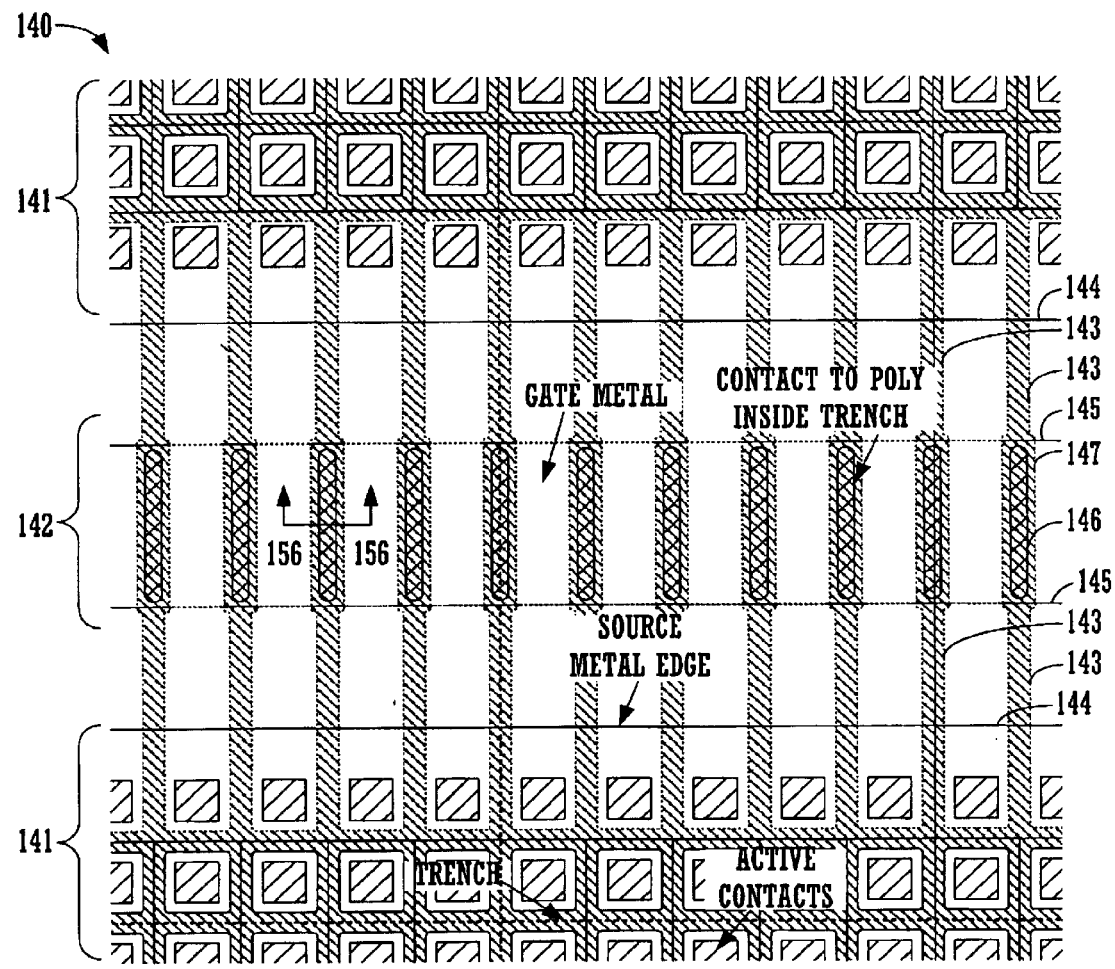
FIG. 15A is a top view of the gate metal and active regions of an MIS device in accordance with a first embodiment of the invention.
Figure 15B:
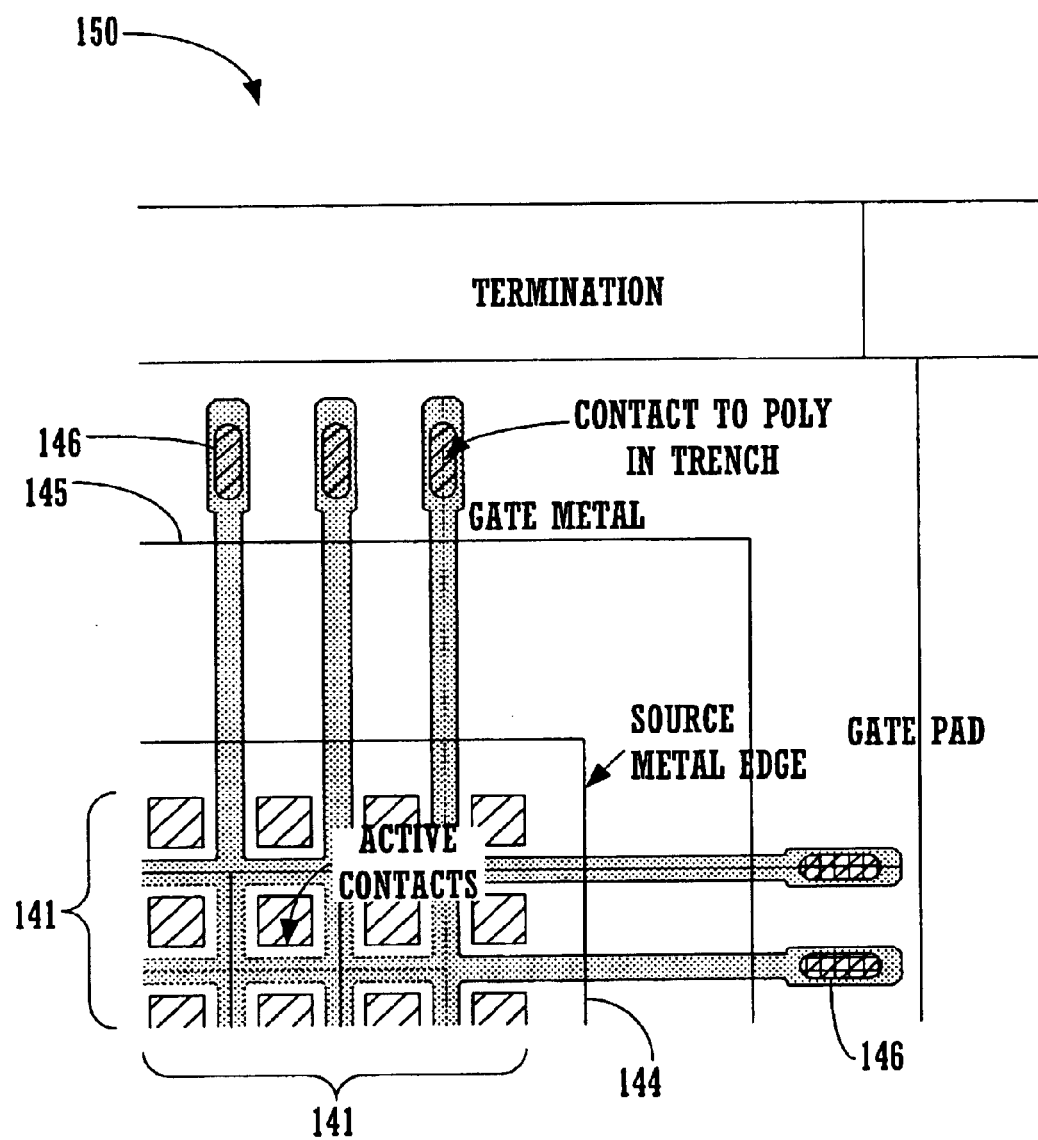
FIG. 15B is a top view of the edge termination and gate pad regions of the first embodiment.
Figure 15C:
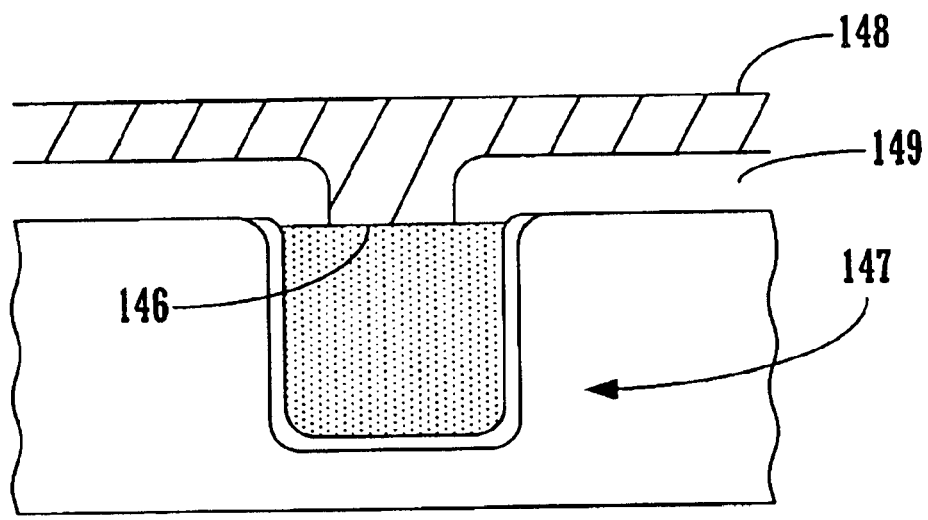
FIG. 15C is a cross-sectional view of the gate contact area in the first embodiment.

FIG. 15A shows a first embodiment of the invention. A square-celled MOSFET 140 includes an active region 141 and a gate metal region 142. A series of parallel gate fingers 143 extend from active region 141 into gate metal region 142. The edges of the source metal are designated 144; the edges of the gate metal are designated 145. Areas 146 designate the areas of contact between the polysilicon within gate fingers 143 and gate metal 145. It will be noted that gate fingers 143 expand into wide portions 147 to accommodate areas of contact 146. This allows for a good electrical contact to be made in the trench, spaced from the upper corners of the trench, even though the dimensions of the active cells become very small. FIG. 15C shows a cross-sectional view of one of the areas of contact 146 at cross-section 15C–15C, showing a gate metal 148 and a BPSG layer 149. FIG. 15B shows a top view of a portion of MOSFET 140 that adjoins a termination region 150 and a gate pad 151.

Figure 16A:
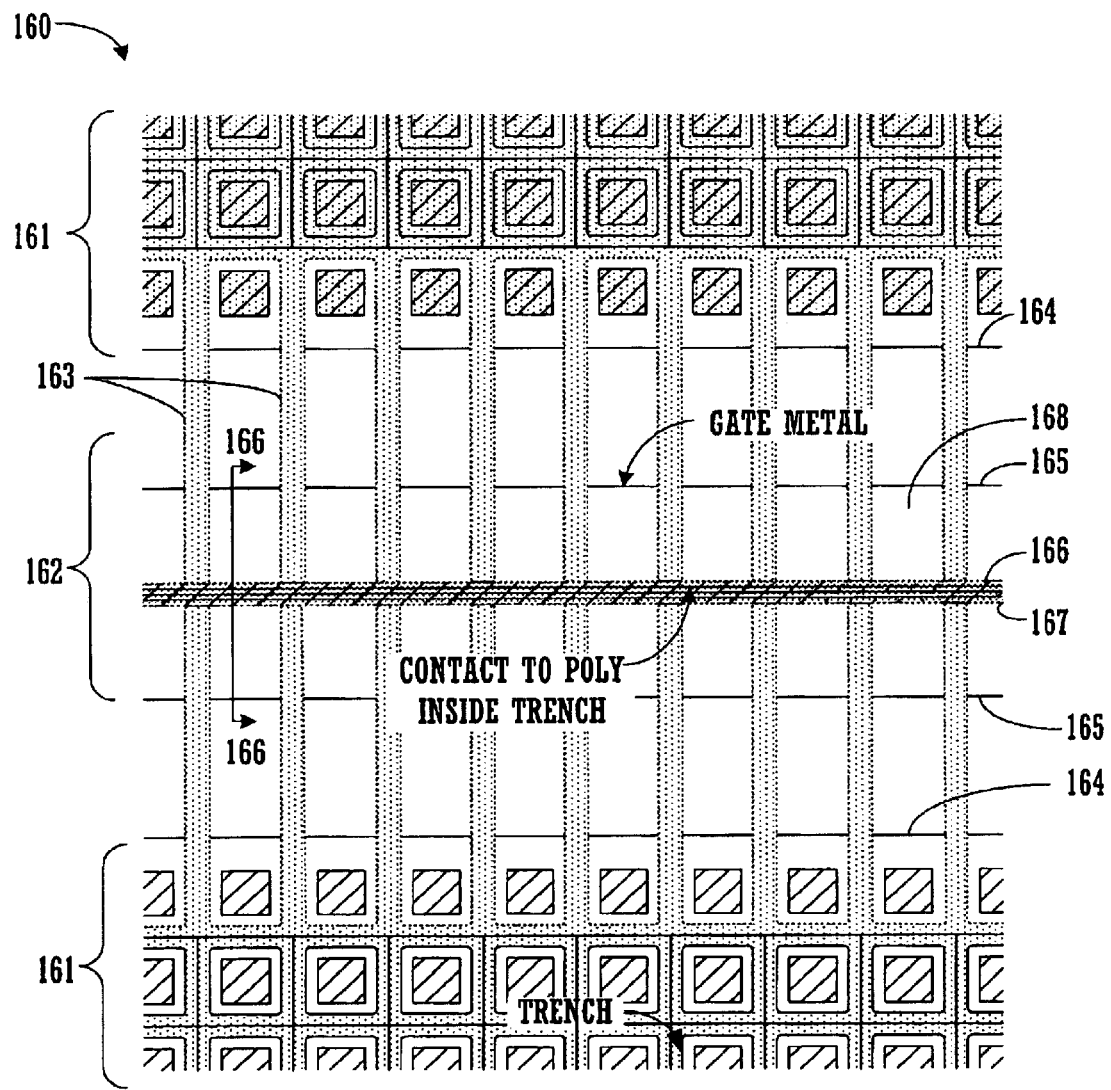
FIG. 16A is a top view of the gate metal and active regions of an MIS device in accordance with a second embodiment of the invention.
Figure 16B:
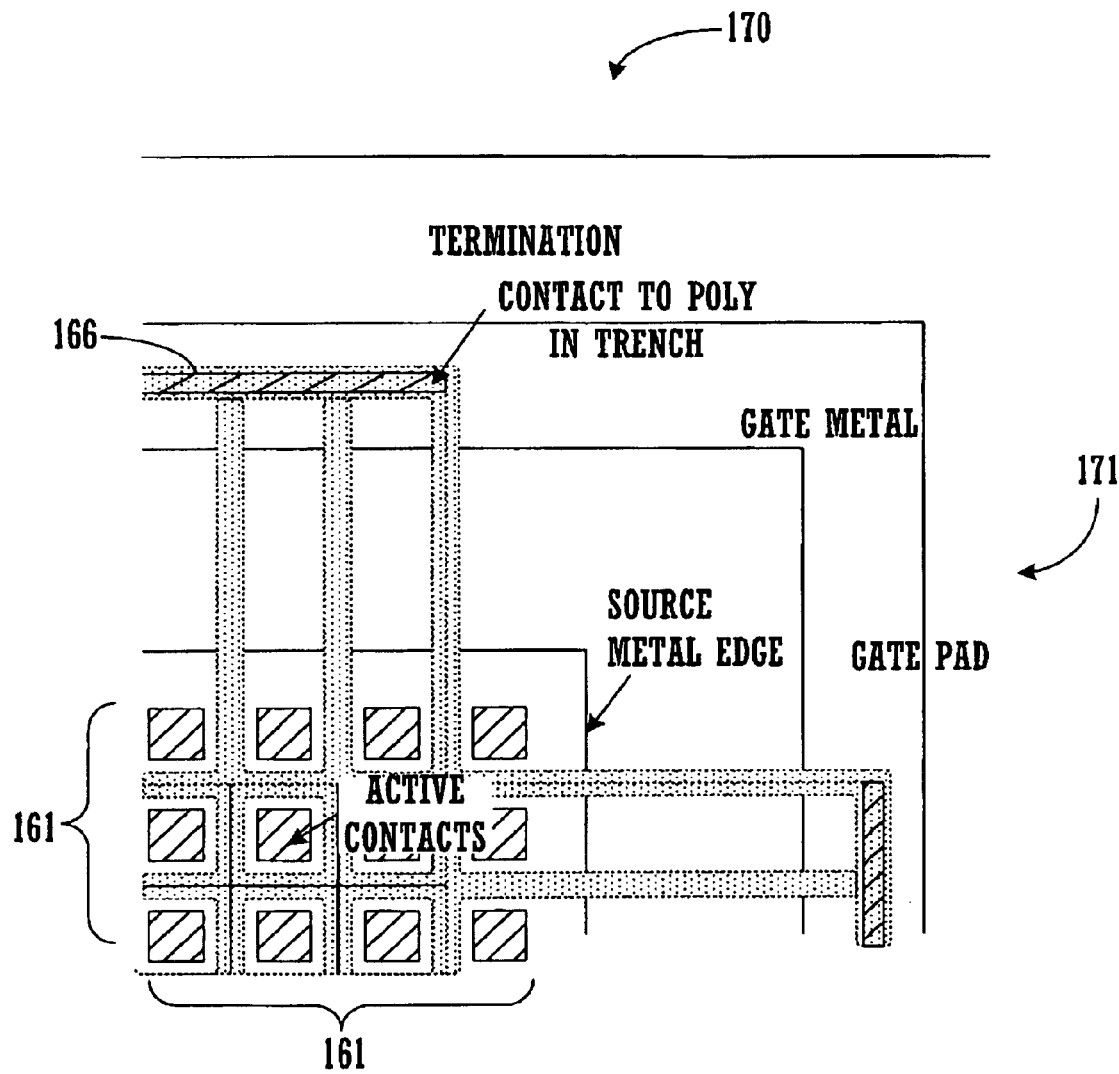
FIG. 16B is a top view of the edge termination and gate pad regions of the second embodiment.
Figure 16C:
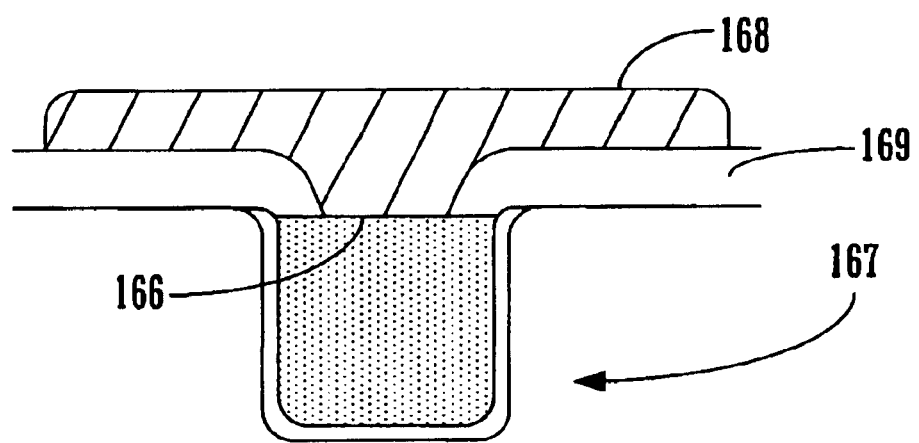
FIG. 16C is a cross-sectional view of the gate contact area in the second embodiment.
Figure 16D:
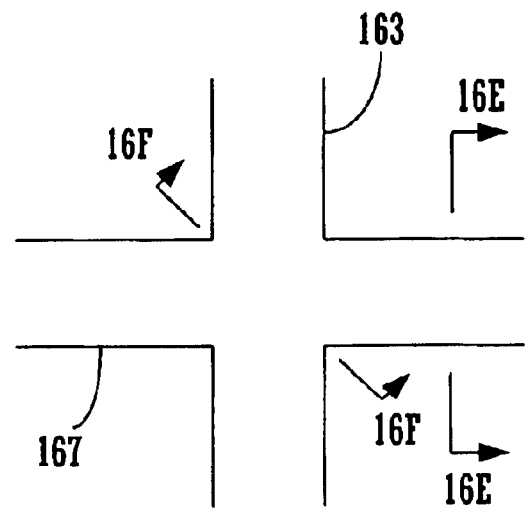
FIG. 16D is a detailed top view of the intersection between a gate finger and the gate finger in which contact between the gate metal and polysilicon is made in the second embodiment.

FIG. 16A shows a second embodiment of the invention. MOSFET 160 contains an active region 161 and a gate metal region 162. The edge of the source metal is shown as 164 and the edge of gate metal 168 is shown as 165. A series of parallel gate fingers 163 extend from active region 161 into gate metal region 162. An area of contact 166 between the gate polysilicon and gate metal 168 is made in a gate finger 167 which extends perpendicular to gate fingers 163. In this embodiment, gate finger 167 is wider than gate fingers 163, but this need not be the case. FIG. 16C shows a detailed cross-sectional view taken at cross-section 16C–16C in FIG. 16A. FIG. 16B is a top view of MOSFET 160 in the vicinity of a termination region 170 and a gate pad 171.

Figure 16E:
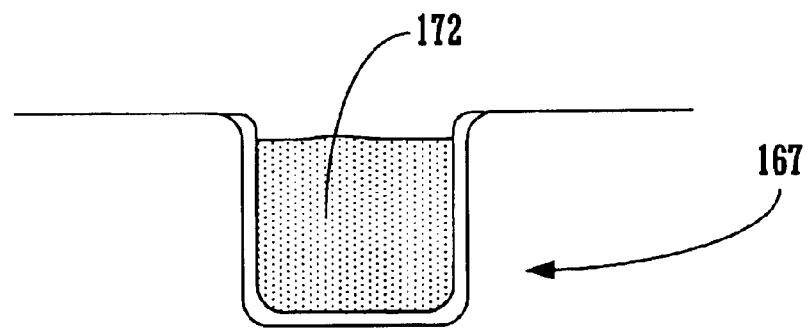
FIG. 16E is a cross-sectional view of the trench in the second embodiment.
Figure 16F:
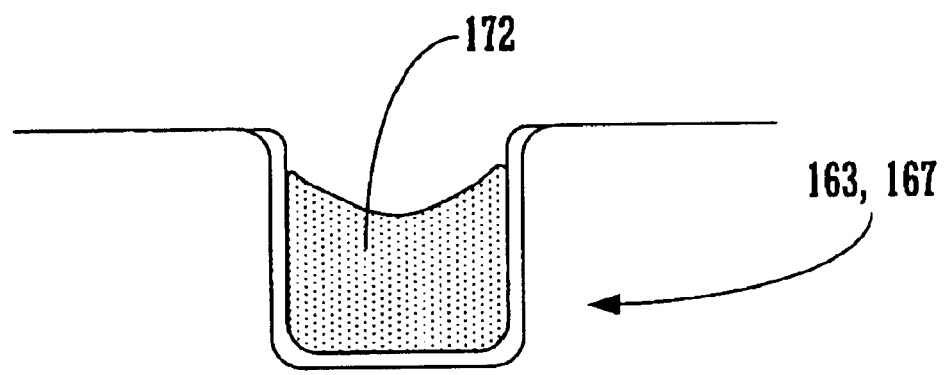
FIG. 16F is a cross-sectional view of the intersection between a gate finger and the gate finger in which contact between the gate metal and polysilicon is made in the second embodiment.

There could be problems in filling the trench at the intersections between gate fingers 163 and gate finger 167, inasmuch as gate finger 167 is wider than gate fingers 163. This possible problem is illustrated in FIGS. 16C–16F. FIG. 16C is a detailed top view of the an intersection between one of gate fingers 163 and gate finger 167. The view at cross-section 16E–16E, shown in FIG. 16E, shows a section of the trench filled with polysilicon 173, whereas at the intersection between gate finger 163 and gate finger 167, represented as cross-section 16F–16F and shown in FIG. 16F, polysilicon 173 does not fill the trench completely.

Figure 17A:
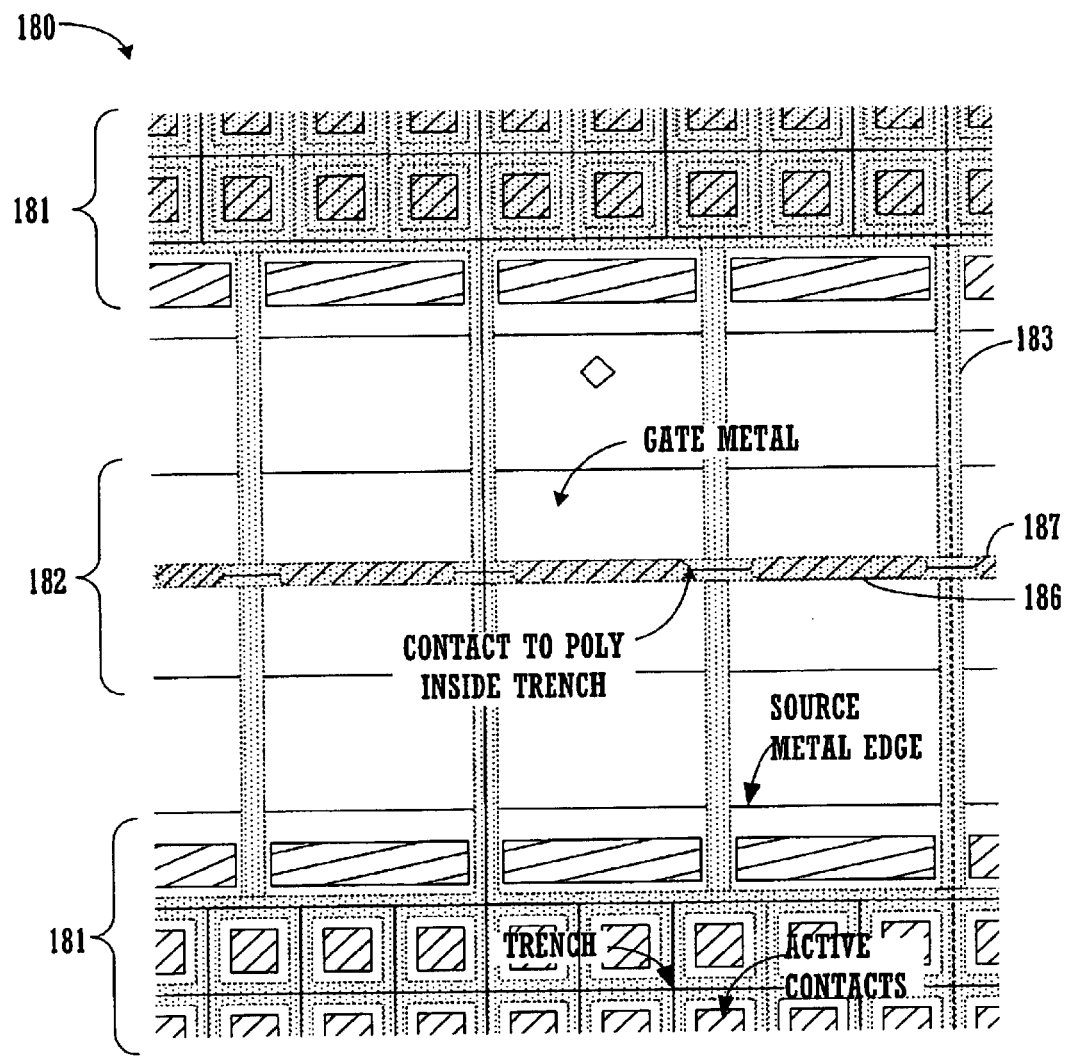
FIG. 17A is a top view of the gate metal and active regions of an MIS device in accordance with a third embodiment of the invention.
Figure 17B:
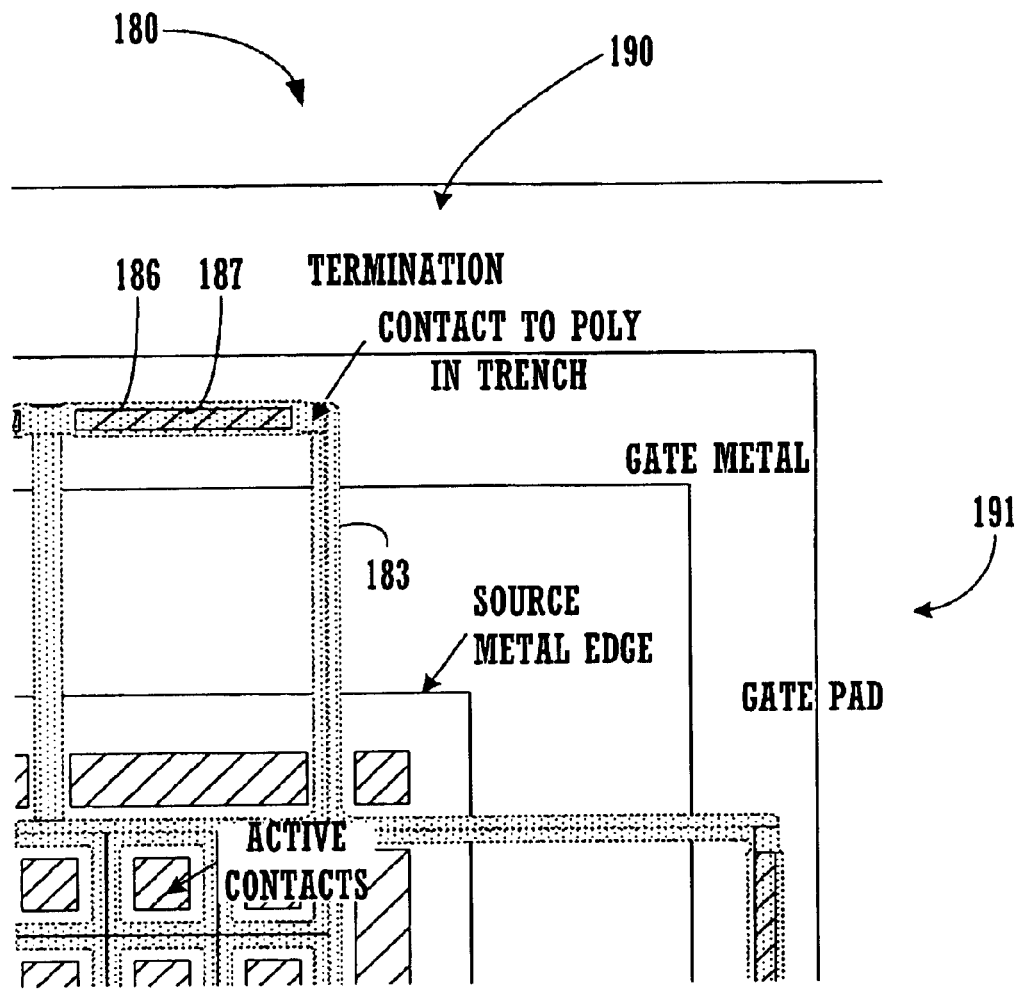
FIG. 17B is a top view of the edge termination and gate pad regions of the third embodiment.

This problem can be overcome in the third embodiment, shown in FIGS. 17A and 17B. MOSFET 180 is similar to MOSFET 160 shown in FIGS. 16A and 16B, except that gate fingers 183 are more widely spaced than gate fingers 163, and gate finger 187 becomes narrower at the intersections with gate fingers 183. Areas of contact 186 between the gate polysilicon and the gate metal do not extend into the areas where gate fingers 183 and 187 intersect. Thus the possible problem caused by the width of gate finger 187 at the intersections with gate fingers 183 is avoided. Of course, the spacing between gate fingers 183 is variable and need not be greater than the spacing between gate fingers 163 in MOSFET 160. FIG. 17B is a top view of MOSFET 180 in the vicinity of termination region 190 and gate pad 191.

Figure 18:
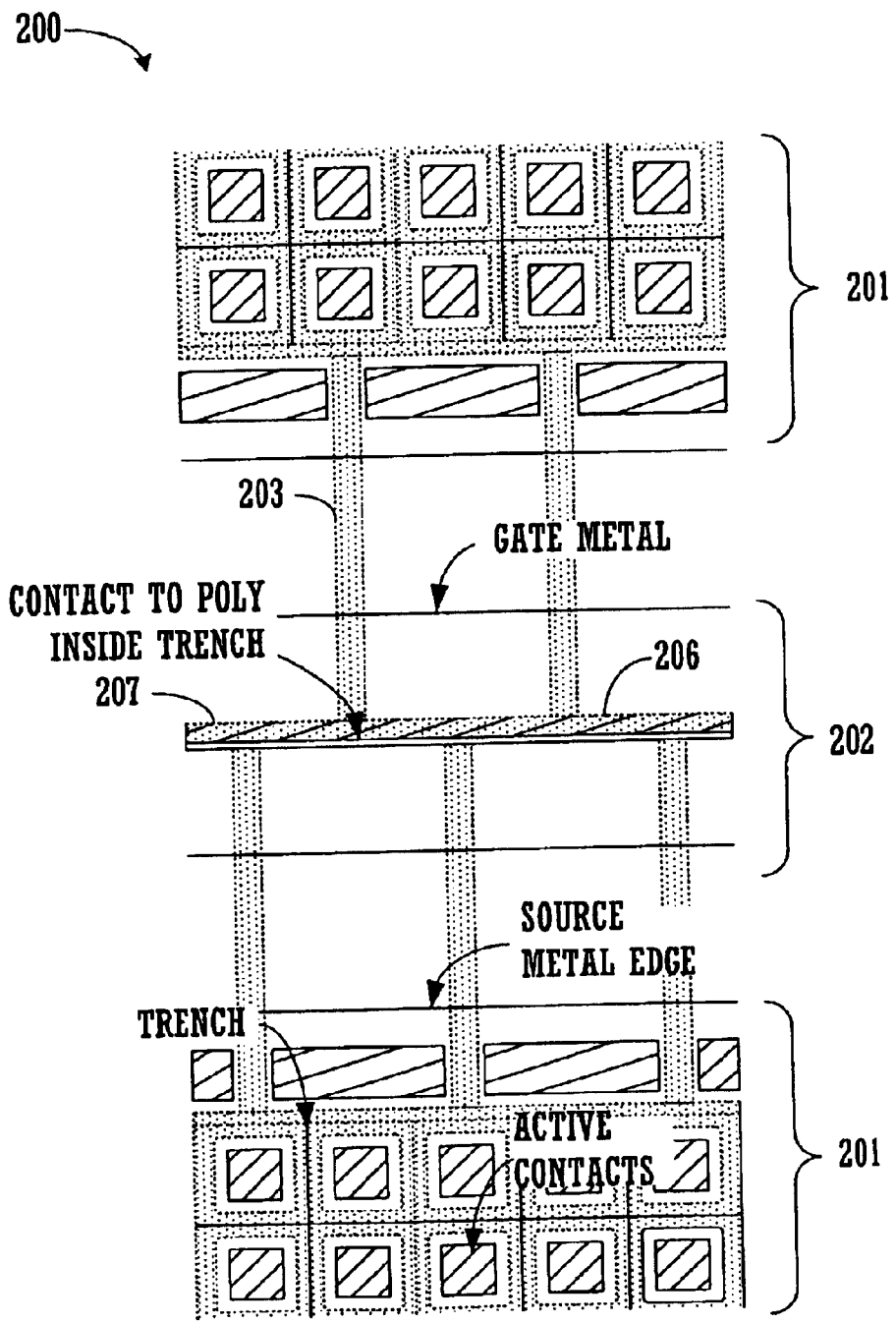
FIG. 18 is a top view of the gate metal and active regions of an MIS device in accordance with a fourth embodiment of the invention.

A fourth embodiment, shown in FIG. 18, represents another way of overcoming the possible trench filling problem described above. MOSFET 200 is somewhat similar to MOSFET 160 shown in FIG. 16A, in the sense that parallel gate fingers 203 running from active region 201 to gate metal region 202 intersect gate finger 207 at right angles, but in MOSFET 200 the intersections between gate finger 207 and gate fingers 203 coming from opposite sides of gate finger 207 are offset, resulting in "T" interesections. As a result, the filling of the trench at the intersections is improved as compared with the configuration shown in FIG. 16A. Contact between the polysilicon gate and gate metal is made in an area of contact 206 which runs longitudinally along gate finger 207.

Figure 19:
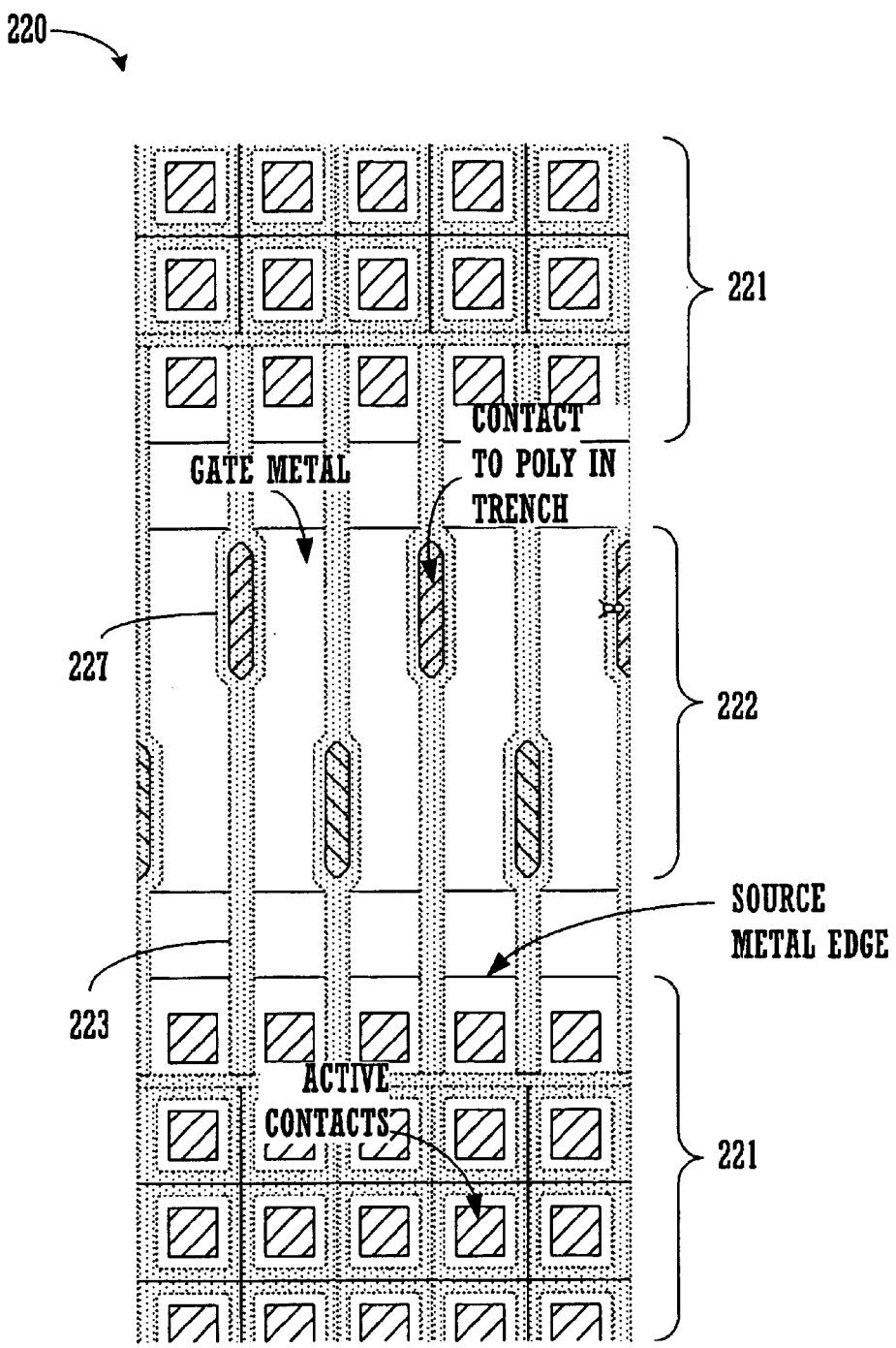
FIG. 19 is a top view of the gate metal and active regions of an MIS device in accordance with a fifth embodiment of the invention.

A fifth embodiment, shown in FIG. 19, is like MOSFET 140 shown in FIG. 15A in that gate fingers 223 include wide portions 227 where contact between the gate polysilicon and the gate metal is made. In MOSFET 220, however, the wide portions 227 are offset from each other in the longitudinal direction of gate fingers 223, thereby allowing the distance between gate fingers 223 to be reduced beyond what would otherwise be possible.

Figure 20B:
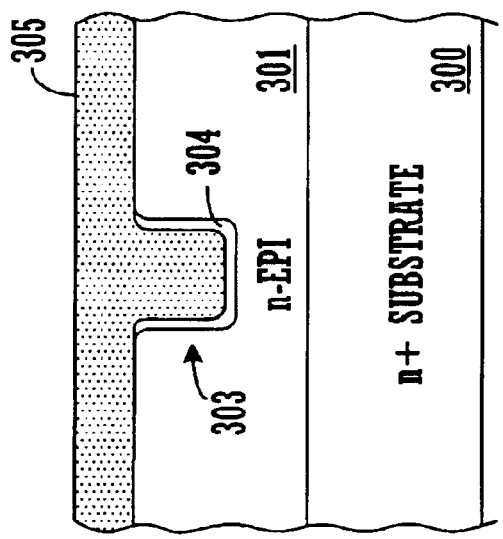
FIGS. 20A–20F illustrate the steps of a process of fabricating a contact between the gate polysilicon and gate metal in an MIS device in accordance with this invention.
Figure 20A:
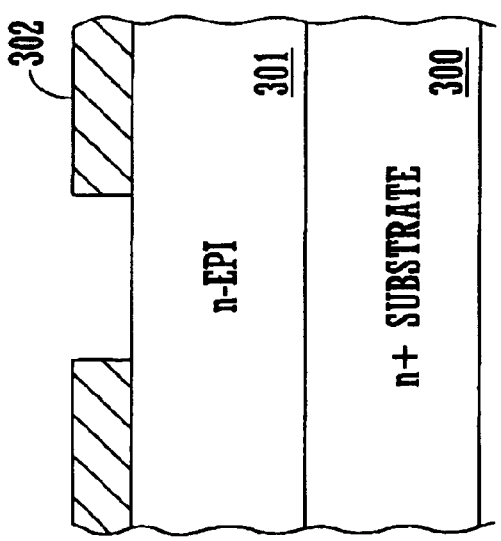

A process for making a gate contact within the trench is shown in FIGS. 20A–20F. The process begins with a semiconductor chip which includes an N-epitaxial layer 301 grown in an N+ substrate 300 using a known process. A photoresist trench mask 302 is formed in the surface of N-epi layer 301, as shown in FIG. 20A. A trench 303, shown in FIG. 20B, is formed by reactive ion etching (RIE) through the opening in trench mask 302. In embodiments where certain portions of the trench are widened to allow for the gate contact (see FIGS. 15A, 16A and 17), this is accomplished by adjusting the width of the opening in the trench mask. Trench mask 302 is then removed Typically, a sacrificial oxide layer (not shown) is formed on the walls of the trench to repair crystal damage done during the RIE etch, and the sacrificial oxide is then removed. A gate oxide layer 304 is thermally grown on the walls of the trench. A polysilicon layer 305 is deposited over the top surface of N-epi layer 301, filling the trench 303, yielding the structure shown in FIG. 20B.

Figure 20D:
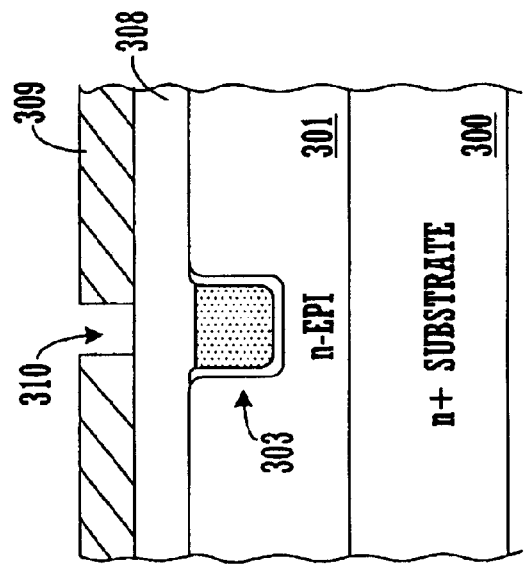
Figure 20C:
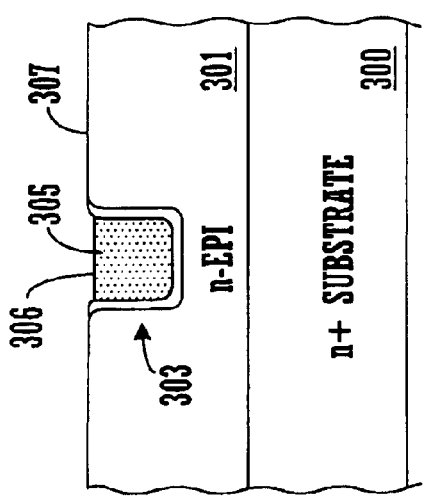

Polysilicon layer 305 is then etched back, as shown in FIG. 20C, until a top surface 306 of polysilicon layer 305 is below a top surface 307 of N-epi layer 301. It is important that the polysilicon layer 305 be etched back far enough that it no longer overlaps the upper corners of trench 303. Surface 306 of polysilicon layer 305 can be just below top surface 307 of N-epi layer 301. Note that, since the polysilicon is etched back uniformly throughout the chip, this process step can normally be performed without a mask, thereby reducing the costs of fabrication.

Next, a borophosphosilicate glass (BPSG) layer 308 is deposited over the top surface of the structure, and masked with a photoresist layer 309. An opening 310 in the photoresist mask is formed over the central portion of the trench 303. such that the edges of opening 310 are spaced laterally inward from the walls of the trench 303. The resulting structure is shown in FIG. 20D.

BPSG layer 308 is etched through the opening 310 in photoresist layer 309, producing a gate contact opening 311 which is generally coincident with opening 310 and which extends to the surface 306 of polysilicon 305. Photoresist layer 309 is then removed, yielding the structure shown in FIG. 20E.

Figure 20F:
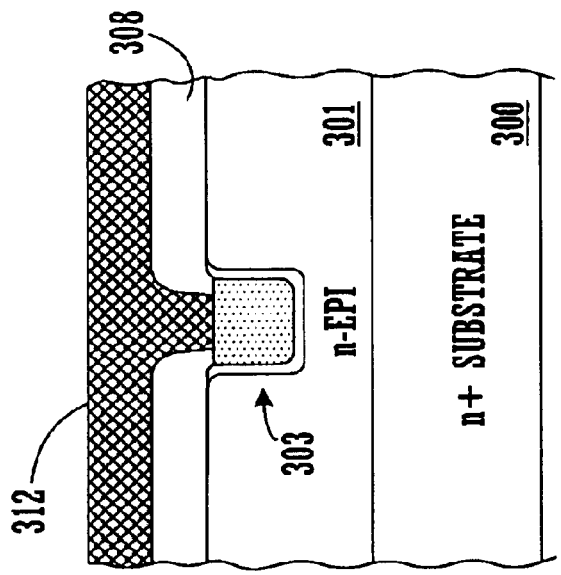
Figure 20E:
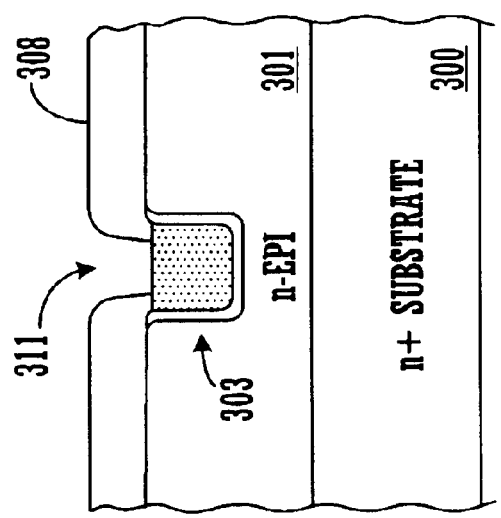

As shown in FIG. 20F, a metal layer 312 is deposited. Since contact between metal layer 312 and polysilicon 305 occurs entirely within a central region of the trench 303, and since the width of the gate contact opening 311 is less than the width of the top surface 306 of polysilicon layer 305, proximity between the polysilicon layer 305 and the N-epi layer 301 at the upper corners of trench 303 is avoided. It is this proximity that creates the stress problems described above.

As described above, the conventional process for forming a trench-gated MOSFET requires numerous mask steps (eight in the example shown in FIGS. 8A–8I) and leaves a ridge in the area of the gate bus which makes photolithography at small dimensions difficult. Another aspect of this invention is an improved process which avoids these problems.

Figure 21E:
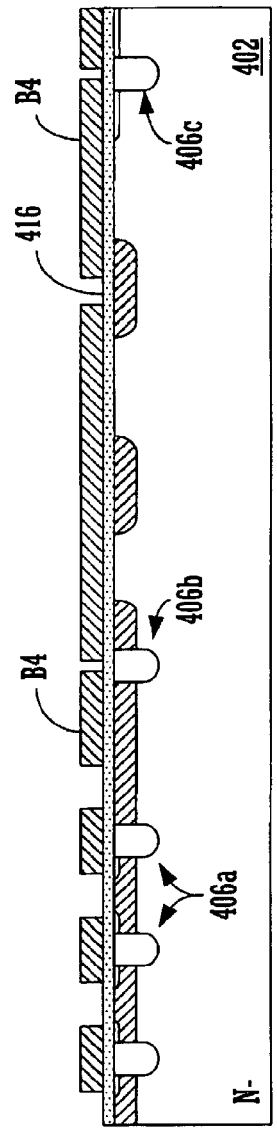

FIGS. 21A–21I illustrate the steps of a process in accordance with this invention. The process starts with an N-layer 402, which could be an epi layer overlying an N+ substrate. Optionally, a thin oxide layer 404 may be formed on the surface of layer 402 for adhesion of the photoresist mask or to provide a hard mask for resist etch selectivity reasons or to avoid later oxidation. Next, a first photoresist mask B1 is formed and patterned to define the locations of the trenches. Since the layer 402 is very flat, mask B1 may be thinner than the masks required in the prior art (e.g., mask A3 shown in FIG. 8D), and smaller features (trenches) may therefore be defined. Trenches 406 are etched through mask B1 using RIE. Trenches 406 include trenches 406A in an active area 407, a gate bus contact trench 406B in a termination area 409, and an optional channel stopper trench 406C in a channel stopper area 411 (FIG. 21A). Trenches 406A and 406B are connected together in the third dimension.

After trenches 406 have been etched, mask B1 is stripped, and a sacrificial oxide layer (not shown) is grown on the walls of trenches 406 and etched to remove crystal defects caused by the RIE process. A gate oxide layer 408 is grown on the walls of trenches 406. A polysilicon layer 410 is deposited, doped and etched back until polysilicon layer 410 remains only inside the trenches 406 (FIG. 21B). Note that unlike the process described in FIGS. 8A–8I, this process requires no polysilicon mask to pattern polysilicon layer 410. A re-oxidation may be performed if a thicker oxide layer is needed over the mesa and termination areas.

A second mask B2 is deposited and patterned to define the regions where the body implant is to be introduced into layer 402. A P-type dopant is implanted through openings in mask B2 and driven in to form P-body regions 412 (FIG. 21C). Unlike the process described in FIGS. 8A–8I, this process requires no mask to define the active area (see, e.g., mask A2 in FIG. 8C). If the designer wishes to pattern the body within the mesa region to achieve a "split-well" structure, as described in J. Zeng et al., ISPSD 2000, pp 145–148, the fact that the surface of the layer 402 is very flat makes small feature lithography easier. The implant energy of the P-type dopant is selected such that the dopant penetrates the oxide layer 408 but not the mask B2. If oxide layer 408 is too thick, it may be etched back to facilitate penetration by the implant.

The mask B2 is then stripped, the structure is cleaned and the P-type dopant is annealed and diffused to achieve the desired junction depth within the N-type layer.

A third mask B3 is deposited and patterned to define the locations of the source regions. N-type dopant is implanted through opening in mask B3 to form N+ source regions 414 (FIG. 21D). Note that the N-type dopant is kept out of the termination area and the periphery of the active area but is allowed into the region near the "channel stopper" trench 406C, forming N+ regions 415, which prevent a surface inversion layer from forming. The surface of the structure is still very flat, making photolithography relatively easy. The oxide layer 408 may need to be etched down with mask B3 in place, depending on the ion species to be implanted through the oxide layer 408.

Mask B3 is stripped and the structure is cleaned again.

Figure 21F:
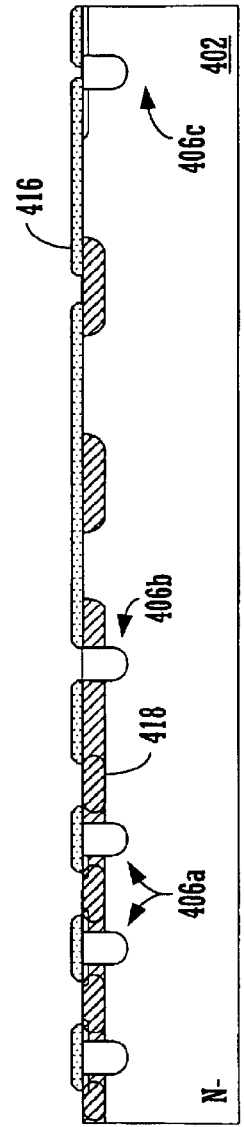

A layer 416 of a dielectric such as BPSG is deposited and densified if necessary. A fourth mask B4 is deposited over BPSG layer 416 and patterned to define the contact openings (FIG. 21E). Since the structure is still quite flat, this lithography step may be performed with a thinner layer of photoresist than, for example, mask A6 shown in FIG. 8H. After BPSG layer 416 is etched through openings in mask B4, mask B4 is removed and P-type dopant is implanted to form P-type contact regions 418 (FIG. 21F). This implant reduces the resistance between the metal layer to be deposited and the body, and it may also be used to shift avalanche breakdown from the region adjacent to the trenches to the central region of the mesas between the trenches, as described in U.S. Pat. No. 5,072,266 to Bulucea et al. If this technique is hampered because the body junction is too deep, a series of distributed avalanche clamps can be created by patterning regions where the body implant is blocked, creating curved junctions where the dopant diffuses laterally. The spacing between the curved junctions can be controlled to set the breakdown voltage to be lower than that of the active trenches. The source contact must be interrupted in these regions. Alternatively, the breakdown voltage can be set by designing the breakdown voltage in the termination area 409 to be lower than the breakdown voltage in the active area 407.

Note that the contact is made to the gate within trench 406B, thereby eliminating the need for a polysilicon mask. The flatness of the layer 402 makes it easier to define a small contact opening in the BPSG layer 416.

Alternatively, two separate masks can be used to form the contact openings through BPSG layer 416 to the polysilicon layer 410 in gate bus contact trench 406B and to N-layer 402, respectively, instead of using a single mask B4.

The structure is now subjected to a high temperature anneal in the range of 750° C. to 950° C. This activates the P+ contact implant, activates the N+ source implant (if it has not already been activated) and densities and smoothes the BPSG layer 416.

Figure 21G:
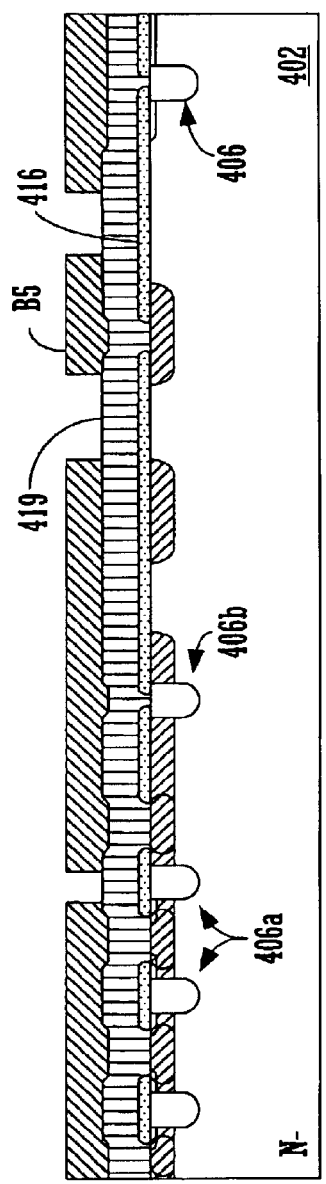
Figure 21H:
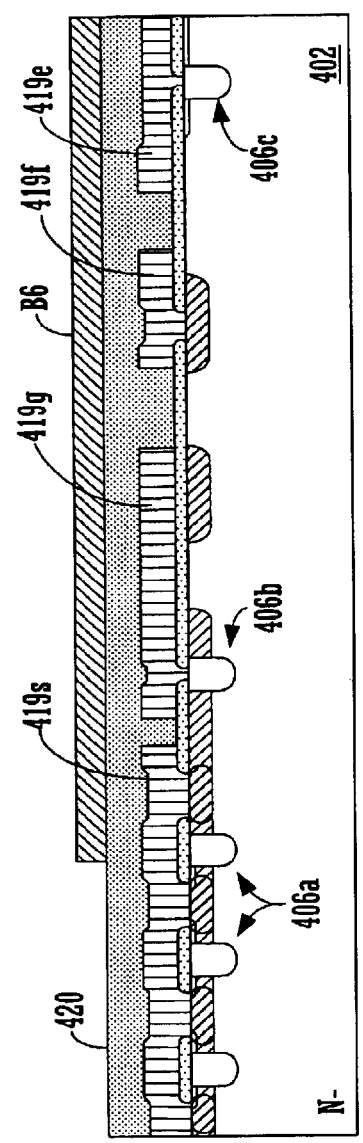
Figure 21I:
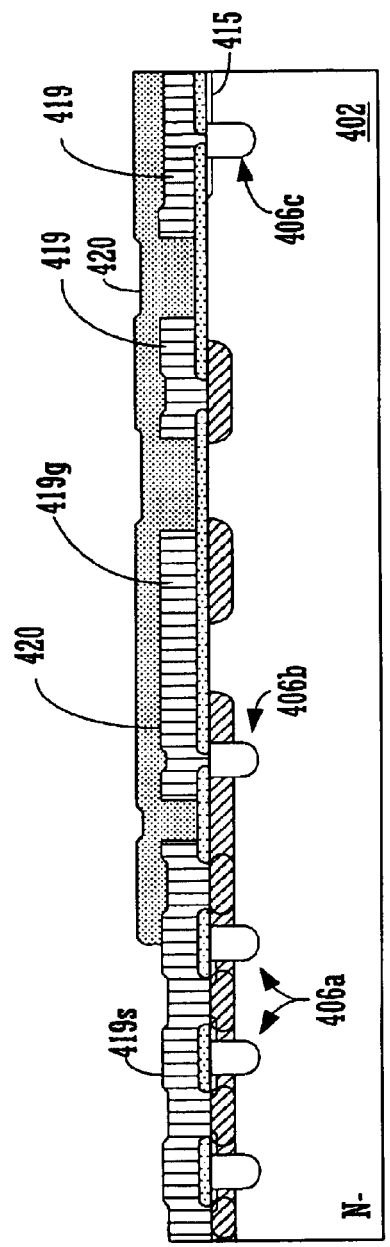

A metal layer 419 is deposited, and a fifth mask B5 is deposited over metal layer 419 and patterned (FIG. 21G). Metal layer 419 is etched through openings in mask B5 into a source metal portion 419S, a gate metal portion 419G, a field plate 41F, and an edge termination 419E. A passivation layer 420 is deposited over metal layer 419, and a sixth mask B6 is deposited and patterned (FIG. 21H). Passivation layer 420 is etched through openings in mask B6 to expose source metal portion 419S (FIG. 21I). Next, the wafer can be thinned by grinding it from the back side, and a layer of back side metal can be applied as is customary to form the drain contact.

The process illustrated in FIGS. 21A–21I offers a number of advantages over prior art processes such as the one shown in FIGS. 8A–8I. The process of this invention has fewer steps and is less costly. For example, six masking steps are required instead of eight. A high degree of silicon flatness is maintained throughout the process until metal deposition, and this helps in the photolithographic delineation of small features and the fabrication of small cell pitches. All contact to the gate is made within the trenches, thus avoiding the current leakage problems that occur as a result of Fowler-Nordheim tunneling through the gate oxide at the upper corners of the trenches when the polysilicon gate material extends out of the trenches and onto the top surfaces of the mesas.

In addition, the area around the "channel-stopper" trench 406C is free of P-type diffusions and may be provided with a field plate that is coupled to the drain via trench 404C as shown in FIG. 21I. The N+ regions 415 at the periphery track the drain potential because the sawed edge of the chip behaves as a resistive short to the drain. This structure improves the reliability of higher voltage terminations by terminating any inversion layer that may form as a result of charges over the terminations or hot carrier aided walk-out.

The process shown in FIGS. 21A–21I may be adapted simply to provide a trench MOSFET with an integrated Schottky diode, such as a Trench-MOS Barrier Schottky (TMBS) device. FIGS. 22A–22I illustrate the steps of an alternative process for forming a trench MOSFET with a Trench-MOS Barrier Schottky device. The process includes one additional mask compared with the process shown in FIGS. 21A–21I.

The process starts with an N-silicon layer 502, which again could overlie a heavily-doped substrate. Optionally, a thin oxide layer 504 may be formed on the surface of layer 502 for adhesion of the photoresist mask or to provide a hard mask for resist etch selectivity reasons or to avoid later oxidation. Next, a first photoresist mask C1 is formed and patterned to define the locations of the trenches. Since the surface of layer 502 is very flat, mask C1 may be thinner than the masks required in the prior art (e.g., mask A3 shown in FIG. 8D), and smaller features (trenches) may therefore be defined. Trenches 506 are etched through mask C1 using RIE. Trenches 506 include trenches 506A in an active area 507, a gate bus contact trench 506B in a termination area 509, an optional channel stopper trench 506C in a channel stopper area 511, and trenches 506D in a Schottky diode area 513 (FIG. 22A). Trenches 506A and 506B (and optionally trenches 506D) are connected together in the third dimension.

After trenches 506 have been etched, mask C1 is stripped, and a sacrificial oxide layer is grown on the walls of trenches 506 and etched to remove crystal defects caused by the RIE process. A gate oxide layer 508 is grown on the walls of trenches 506. A polysilicon layer 510 is deposited, doped and etched back until polysilicon layer 510 remains only inside the trenches 506 (FIG. 22B). Like the process described in FIGS. 21A–21I, this process requires no polysilicon mask to pattern polysilicon layer 510. A re-oxidation may be performed if a thicker oxide layer is needed over the mesa and termination areas.

Figure 22C:
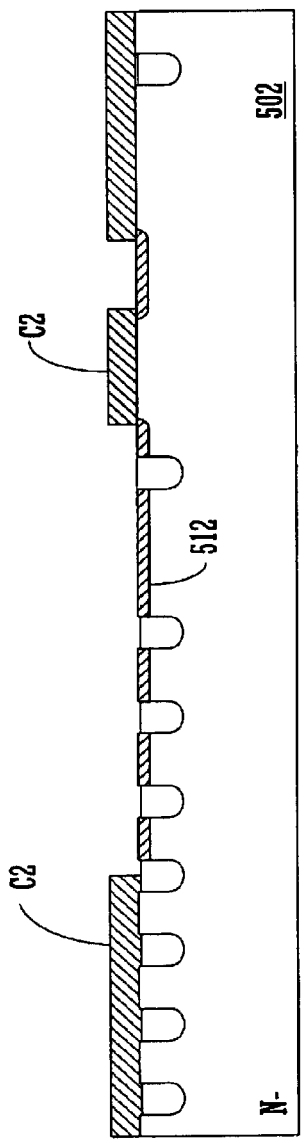

A second mask C2 is deposited and patterned to define the regions where the body implant is to be introduced into layer 502. A P-type dopant is implanted through openings in mask C2 and driven in to form P-body regions 512 (FIG. 22C). Like the process described in FIGS. 21A–21I, this process requires no mask to define the active area (see, e.g., mask A2 in FIG. 8C). The implant energy of the P-type dopant is selected such that the dopant penetrates the oxide layer 508 but not the mask C2. If oxide layer 508 is too thick, it may be etched back to facilitate penetration by the implant.

The mask C2 is then stripped, the structure is cleaned and the P-type dopant is annealed and diffused to achieve the desired junction depth with the N-type layer 502.

Figure 22D:
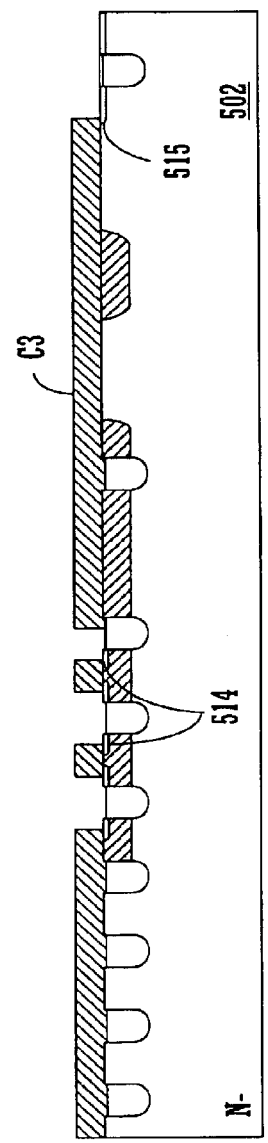

A third mask C3 is deposited and patterned to define the locations of the source regions. N-type dopant is implanted through opening in mask C3 to form N+ source regions 514 (FIG. 22D). Note that the N-type dopant is kept out of the termination area and the periphery of the active area but is allowed into the region near the "channel stopper" trench 506C, forming N+ regions 515. The surface of the structure is still very flat, making photolithography relatively easy. The oxide layer 508 may need to be etched down with mask C3 in place, depending on the ion species to be implanted through the oxide layer 508.

Mask C3 is stripped and the structure is cleaned again.

A layer 516 of a dielectric such as BPSG is deposited and densified if necessary. A fourth mask C4 is deposited over BPSG layer 516 and patterned to define the contact openings (FIG. 22E). Since the structure is still quite flat, this lithography step may be performed with a thinner layer of photoresist than, for example, mask A6 shown in FIG. 8H. After BPSG layer 516 is etched through openings in mask C4, mask C4 is removed. An additional fifth mask (contact block) C5 is deposited and patterned to cover the Schottky diode area 513 and a portion of the channel stopper area 511. P-type dopant is implanted to form P-type contact regions 518, with mask C5 preventing the dopant from getting into the Schottky diode area 513 (FIG. 22F). This implant reduces the resistance between the metal layer to be deposited and the body, and it may also be used to shift avalanche breakdown from the region adjacent to the trenches to the central region of the mesas between the trenches, as described in U.S. Pat. No. 5,072,266 to Bulucea et al. If this technique is hampered because the body junction is too deep, a series of distributed avalanche clamps can be created by patterning regions where the body implant is blocked, creating curved junctions where the dopant diffuses laterally. The spacing between the curved junctions can be controlled to set the breakdown voltage to be lower than that of the active trenches. The source contact must be interrupted in these regions. Alternatively, the breakdown voltage can be set by designing the breakdown voltage in the termination area 509 to be lower than the breakdown voltage in the active area 507.

Note that the contact is made to the gate within trench 506B, thereby eliminating the need for a polysilicon mask.

The flatness of the layer makes it easier to define a small contact opening in the BPSG layer 516.

The structure is now subjected to a high temperature in the range of 750° C. to 950° C. This activates the P+ contact implant, activates the N+ source implant (if it has not already been activated) and drives it to a lower junction depth, and densifies and smoothes the BPSG layer 516.

Figure 22G:
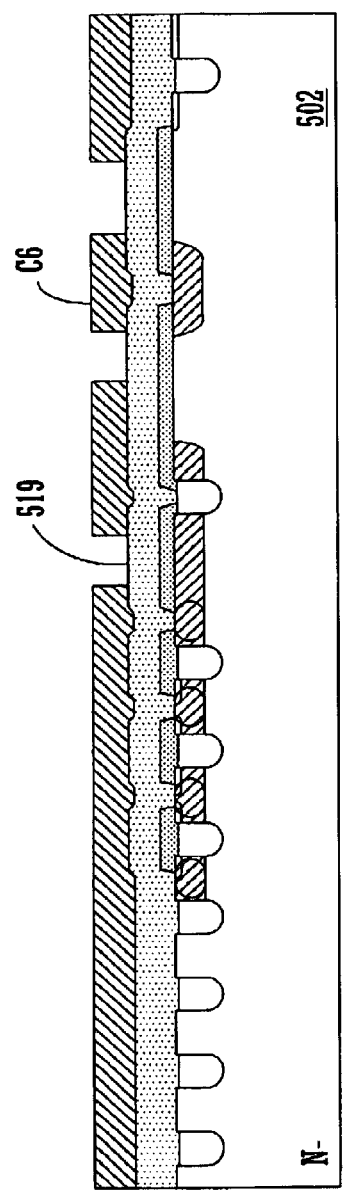
Figure 22H:
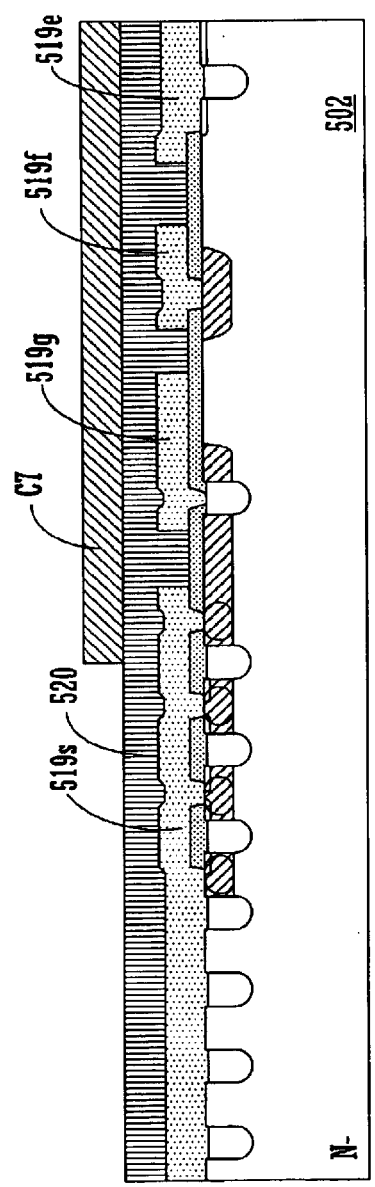
Figure 22I:
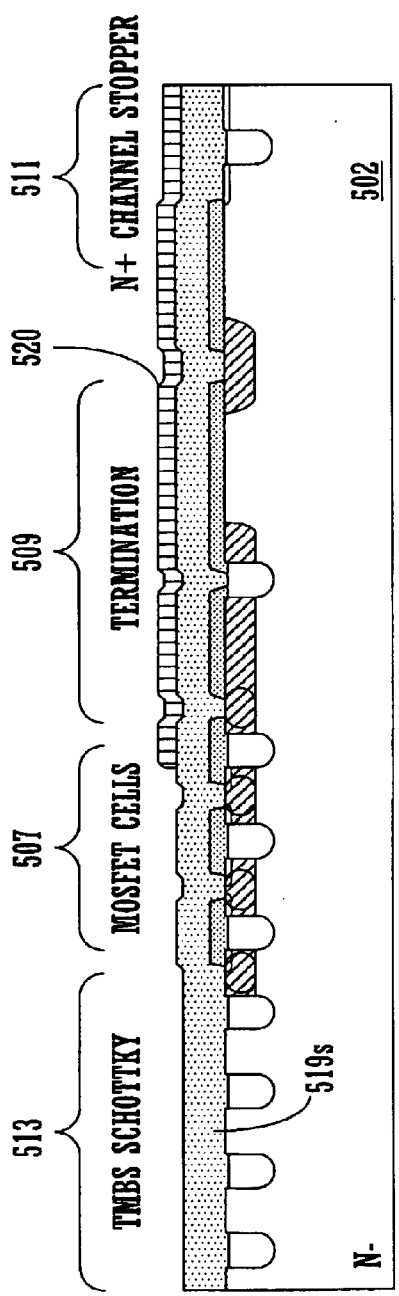

A metal layer 519 is deposited, making contact in particular with the N+ source regions 514 and P-body regions 518 in the active area 507, and with the surface of the layer 502 in the Schottky diode area 513. A sixth mask C6 is deposited over metal layer 519 and patterned (FIG. 22G). Metal layer 519 is etched through openings in mask C6 and divided into a source metal portion 519S in Schottky diode area 513 and active area 505, a gate metal portion 519G, a field plate 519F, and an edge termination 519E. A passivation layer 520 is deposited over metal layer 519, and a seventh mask C7 is deposited and patterned (FIG. 22H). Passivation layer 520 is etched through openings in mask C7 to expose source metal portion 519S (FIG. 22I). Next, the wafer can be thinned by grinding it from the back side, and a layer of back side metal can be applied as is customary to form the drain contact.

Note also that the availability of the fifth mask C5 allows the fourth mask C4 to be held back from the trench 506C, creating an opening in BPSG layer 516 that exposes N+ regions 515 and allows metal layer to make contact with N+ regions 515 as well as the polysilicon in trench 506A. This provides better contact between the field plate edge termination and the drain.

Alternatively, a trench-MOS barrier Schottky (TMBS), an MPS rectifier, or a junction barrier Schottky (JBS) may be formed within the same general process flow. The Schottky diodes may be interspersed among the MOSFET cells in the active area or may be grouped in a separate part of the chip, as shown in FIGS. 22A–22I. The process of FIGS. 22A–22I provides a cost-effective method of replacing the conventional MOSFET-Schottky combination, currently available in a two-chip form. As compared with the basic process shown in FIGS. 21A–21I, only a contact block mask (mask C5 in FIG. 22F) needs to be added. In the eight-mask prior art process shown in FIGS. 8A–8I, including Schottky diodes would raise the mask count by two (a body block mask and a contact block mask), resulting in a total of ten masks.

Another alternative of the basic process allows the integration of polysilicon diodes into the device. FIGS. 24A–24I illustrate the steps of such a process which involves the addition of one mask.

Figure 23A:
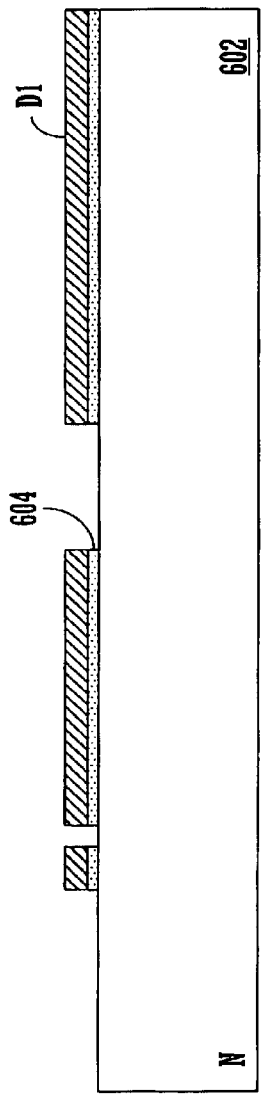
FIGS. 23A–23J illustrate the steps of a conventional process for forming a trench MOSFET with integrated polysilicon diodes.

The conventional process is illustrated in FIGS. 23A–23J, requiring 9 masks. An oxide layer 604 and a first photoresist mask D1 are deposited on an N+ silicon layer 602 and are patterned with openings in the areas were P-type tubs are to be formed (FIG. 23A).

Figure 23B:
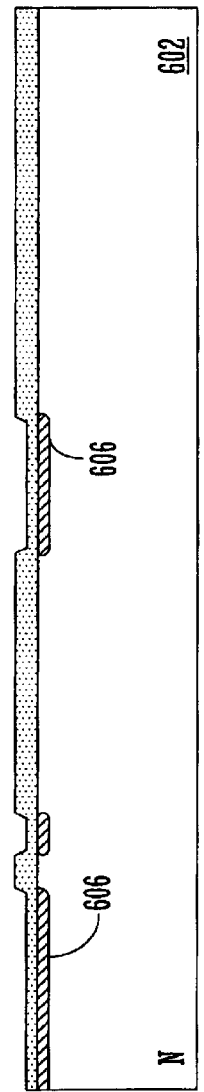
Figure 23C:
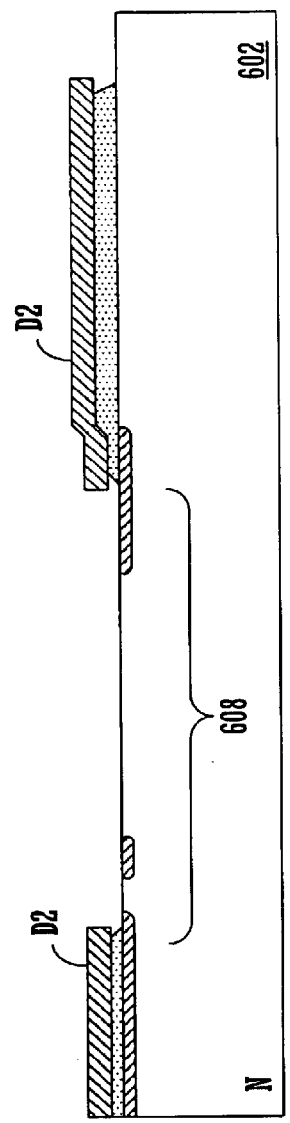
Figure 23D:
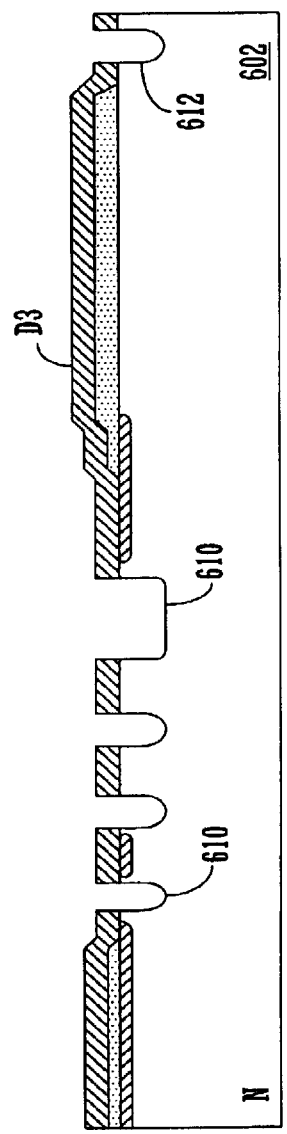
Figure 23E:
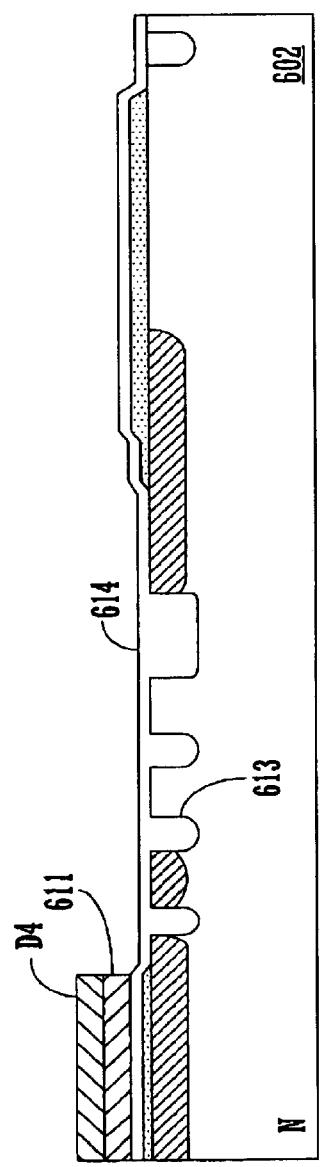

A P-type dopant is implanted through the openings in mask D1 and driven in, forming P-type tubs 606 (FIG. 23B). After mask D1 has been removed, a second photoresist mask D2 is formed with an opening defining the location of an active area 608. Oxide layer 604 is etched through the opening in mask D2 (FIG. 23C), and mask D2 is removed. A third photoresist mask D3 is formed, defining the locations of the trenches. Layer 602 is etched to form trenches 610 in active area 608 and a trench 612 in the channel stopper area (FIG. 23D).

A sacrificial oxide layer is formed and removed from the walls of trenches 610, 612, and a gate oxide layer is formed on the walls of the trenches. A polysilicon layer 614 is deposited and an N-type background dopant is implanted into polysilicon layer 614. A low temperature oxide (LTO) layer 611 is deposited. A fourth photoresist mask D4 is deposited over the region of polysilicon layer 614 where the diodes are to be formed. Using photoresist mask D4, LTO 611 layer is etched to form a mask (FIG. 25E), and photoresist mask D4 is removed. Polysilicon layer 614 is then doped with $POCl_3$, using LTO layer 611 as a mask.

Figure 23F:
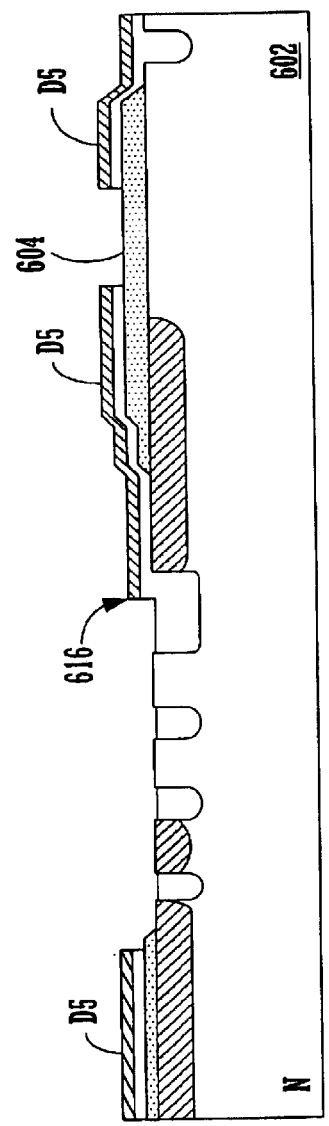

A fifth mask D5 is deposited, and polysilicon layer 614 is etched back into the trenches 610 except in region 616, where a portion of the polysilicon is allowed to overlap the edge of the trench and extend over the oxide layer 604 (FIG. 23F). Mask D5 is removed.

Figure 23G:
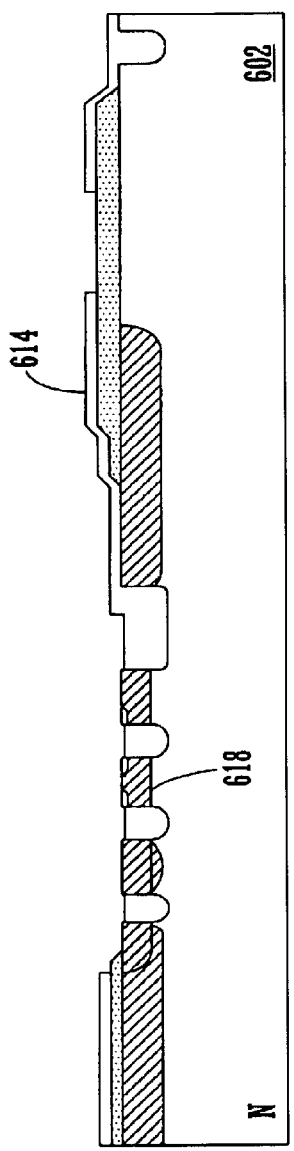

A P-type dopant is implanted in the vicinity of trenches 610 and driven in to form P-body region 618 (FIG. 23G).

Figure 23H:
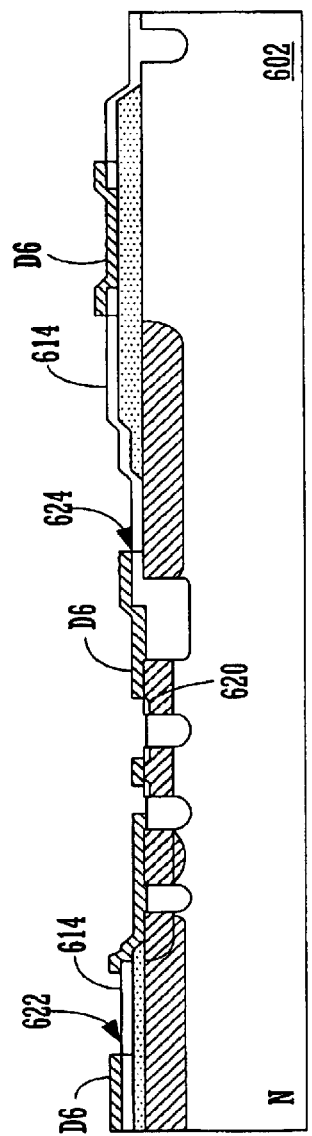

A sixth N+ block mask D6 is deposited and patterned. N-type dopant is implanted to form N+ source regions adjacent to trenches 610. The N-type dopant also enters portions of polysilicon layer 614, where it forms diodes 622 and 624 at junctions with the N-type background-doped regions of polysilicon layer 614 (FIG. 23H). Mask D6 is removed.

Figure 23I:
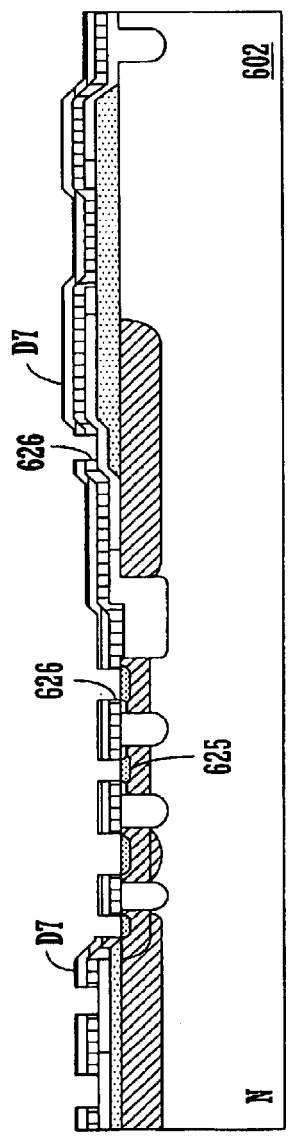

A BPSG layer 626 is deposited and a seventh contact mask D7 is deposited and patterned over BPSG layer 626. Openings in mask D7 define where contact will be made to various areas of the device. BPSG layer 626 is etched through the openings in mask D7, and P-type dopant is implanted through the openings in BPSG layer 626 to form P+ contact regions 625 (FIG. 23I). Mask D7 is removed.

Figure 23J:
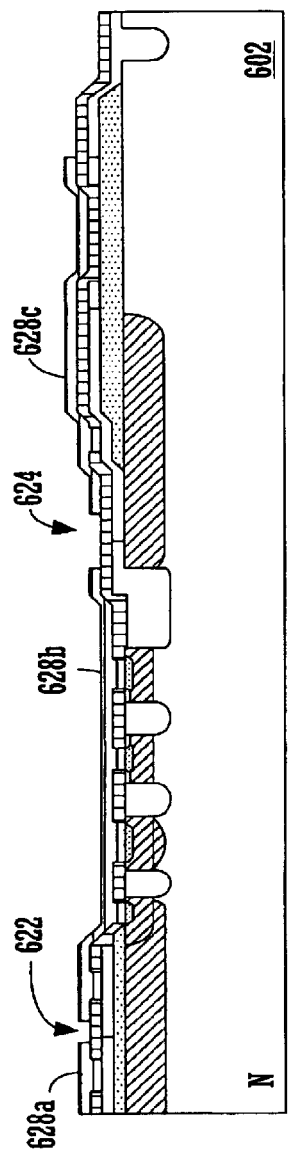

A metal layer 628 is deposited, metal layer 628 making contact with the device through the openings in BPSG layer 626. An eighth mask (not shown) is formed over metal layer 628. Metal layer 628 is etched through openings in the eighth mask to form a portion 628A which contacts the anode of diode 622, a portion 628B which contacts the cathode of diode 622 and the source-body regions of the MOSFETs in the active area, and a portion 628C which contacts the cathode of diode 624 (FIG. 23J). Another section of metal layer 628 (not shown) contacts the polysilicon gate (which is also the anode of diode 624) in the third dimension.

Portion 628A of metal layer 628 is connected to the polysilicon gate, and portion 628C of metal layer 628 is connected to the drain of the device (both in the third dimension). Thus diode 622 connects the source-body and the gate and diode 624 connects the drain and the gate. However, to fabricate the device requires nine masking steps if a final passivation and pad mask are implemented.

The foregoing prior art process can be contrasted with the process shown in FIGS. 24A–24I, wherein the number of masking steps is reduced to seven.

The process starts with an N-layer 702, which could be an epi layer overlying an N+ substrate. Optionally, a thin oxide layer 704 may be formed on the surface of layer 702 for adhesion of the photoresist mask or to provide a hard mask for resist etch selectivity reasons or to avoid later oxidation. Next, a first photoresist mask E1 is formed and patterned to define the locations of the trenches. Since the surface of layer 702 is very flat, mask E1 may be thinner than the masks required in the prior art (e.g., mask A3 shown in FIG. 8D), and smaller features (trenches) may therefore be defined. Trenches 706 are etched through mask E1 using RIE. Trenches 706 include trenches 706A in an active area 707, a gate bus contact trench 706B in a termination area 709, and an optional channel stopper trench 706C in a channel stopper area 711 (FIG. 24A). Trenches 706A and 706B are connected together in the third dimension.

After trenches 706 have been etched, mask E1 is stripped, and a sacrificial oxide layer is grown on the walls of trenches 706 and etched to remove crystal defects caused by the RIE process. A gate oxide layer 708 is grown on the walls of trenches 706. A polysilicon layer 710 is deposited, doped and etched back until polysilicon layer 710 remains only inside the trenches 706 (FIG. 24B). A re-oxidation may be performed if a thicker oxide layer is needed over the mesa and termination areas.

Figure 24C:
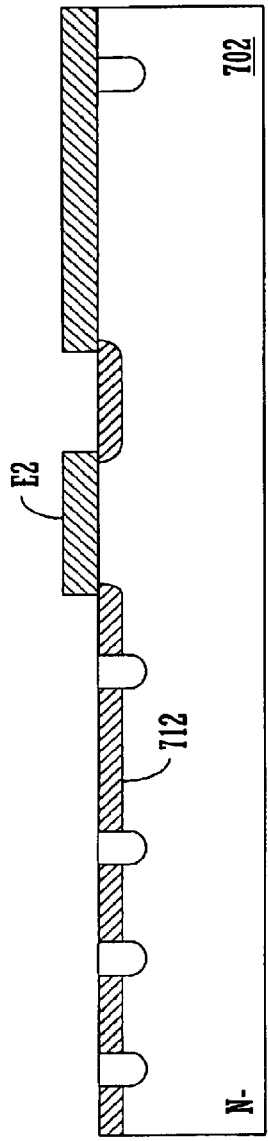

A second mask E2 is deposited and patterned to define the regions where the body implant is to be introduced into layer 702. A P-type dopant is implanted through openings in mask E2 and driven in to form P-body regions 712 (FIG. 24C). Mask E2 is removed.

Figure 24D:
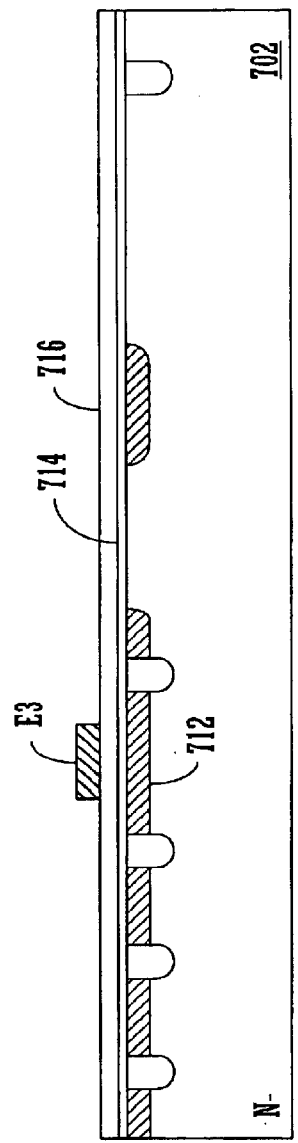

A low temperature oxide (LTO) layer 714 is deposited over the surface of layer 702 to a thickness of, for example 2000 Å, and a second polysilicon layer 716 is deposited over layer 714. A blanket implant of polysilicon layer 716 with P-type dopant is performed. A third mask E3 is deposited over layer 702 and patterned to define the location of a polysilicon diode (FIG. 24D).

Figure 24E:
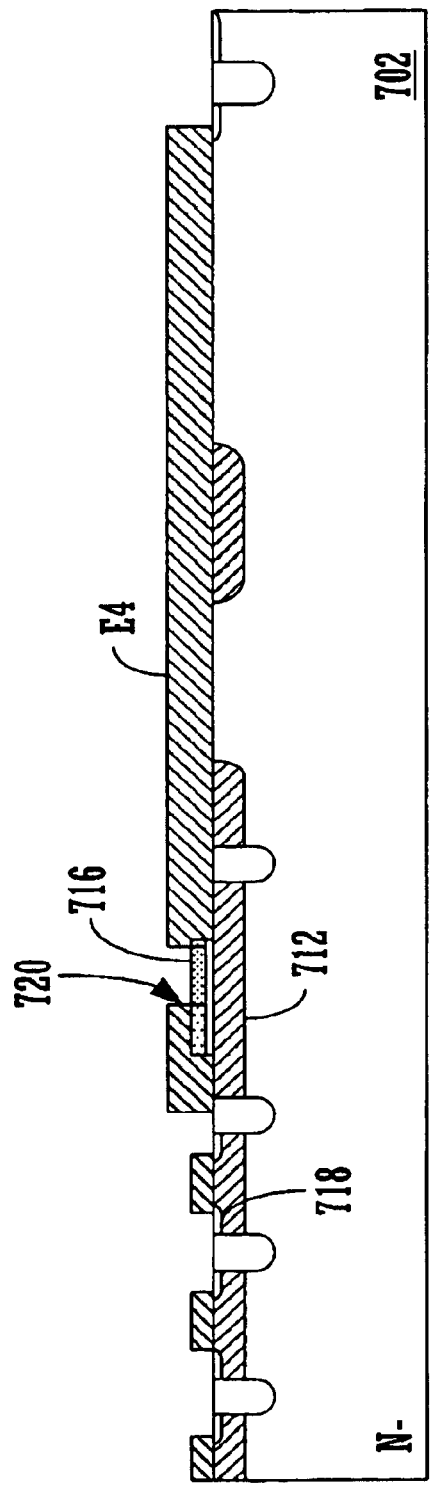

Polysilicon layer 716 and LTO layer 714 are etched through the openings in mask E3, defining the polysilicon diode, and mask E3 is removed. A fourth mask E4 is deposited, and N-type dopant is implanted through the openings in mask E4, simultaneously forming N+ source regions 718 and the cathode of a diode 720 (FIG. 24E). Mask E4 is removed.

Figure 24F:
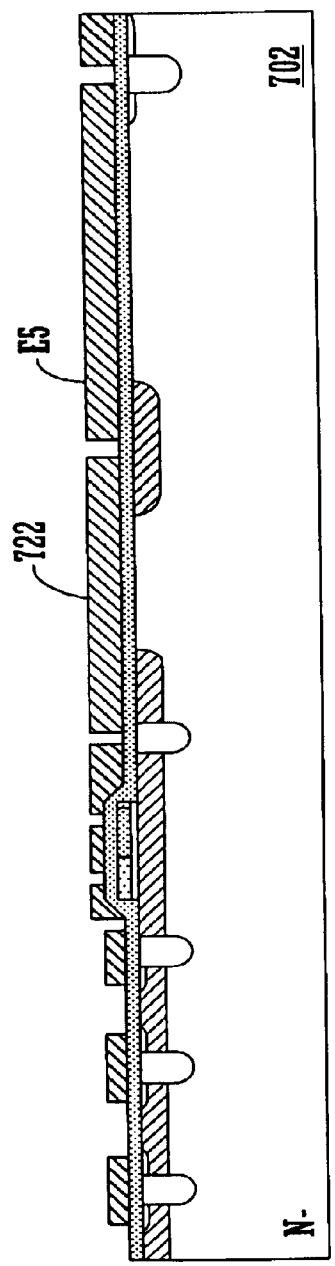
Figure 24G:
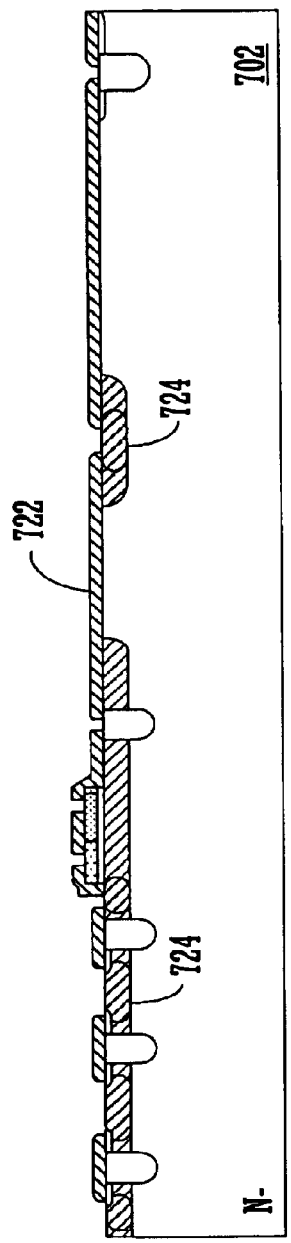

Next a BPSG layer 722 is deposited and a fifth mask E5 is deposited over BPSG layer 722 and patterned (FIG. 24F). BPSG layer 722 is etched through openings in mask E5 to create contact openings in BPSG layer 722, and mask E5 is removed. P-type dopant is implanted through the openings in BPSG layer 722 to form contact regions 724 (FIG. 24G). BPSG layer 722 is reflowed by heating.

Figure 24H:
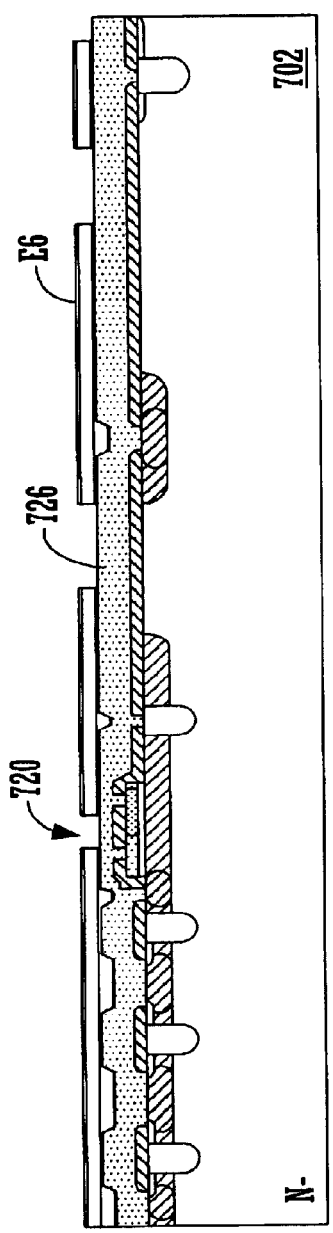
Figure 24I:
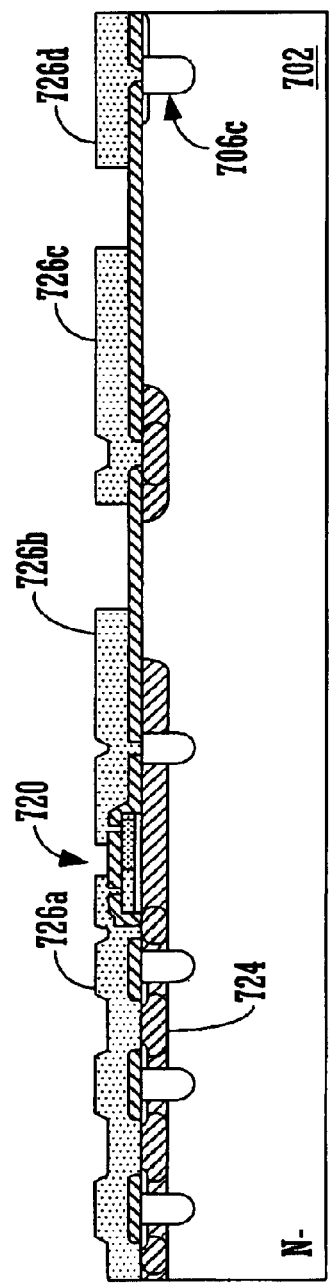

A metal layer 726 is deposited over BPSG layer 722, establishing electrical contact with the device through the openings in BPSG layer 722. A sixth mask E6 is deposited over metal layer 726 and is patterned (FIG. 24H). Metal layer 726 is etched through openings in mask E6 to separate metal layer 726 into a portion 726A that contacts the source-body terminals of the MOSFETs and the anode of diode 720, a portion 726B that contacts the cathode of diode 720 and the polysilicon in trench 706B in the gate bus area of the device, a portion 726C that forms a field plate in the termination area of the device, and a portion 726D that contacts the polysilicon in trench 706C in the channel stopper area of the device.

Figure 27A:
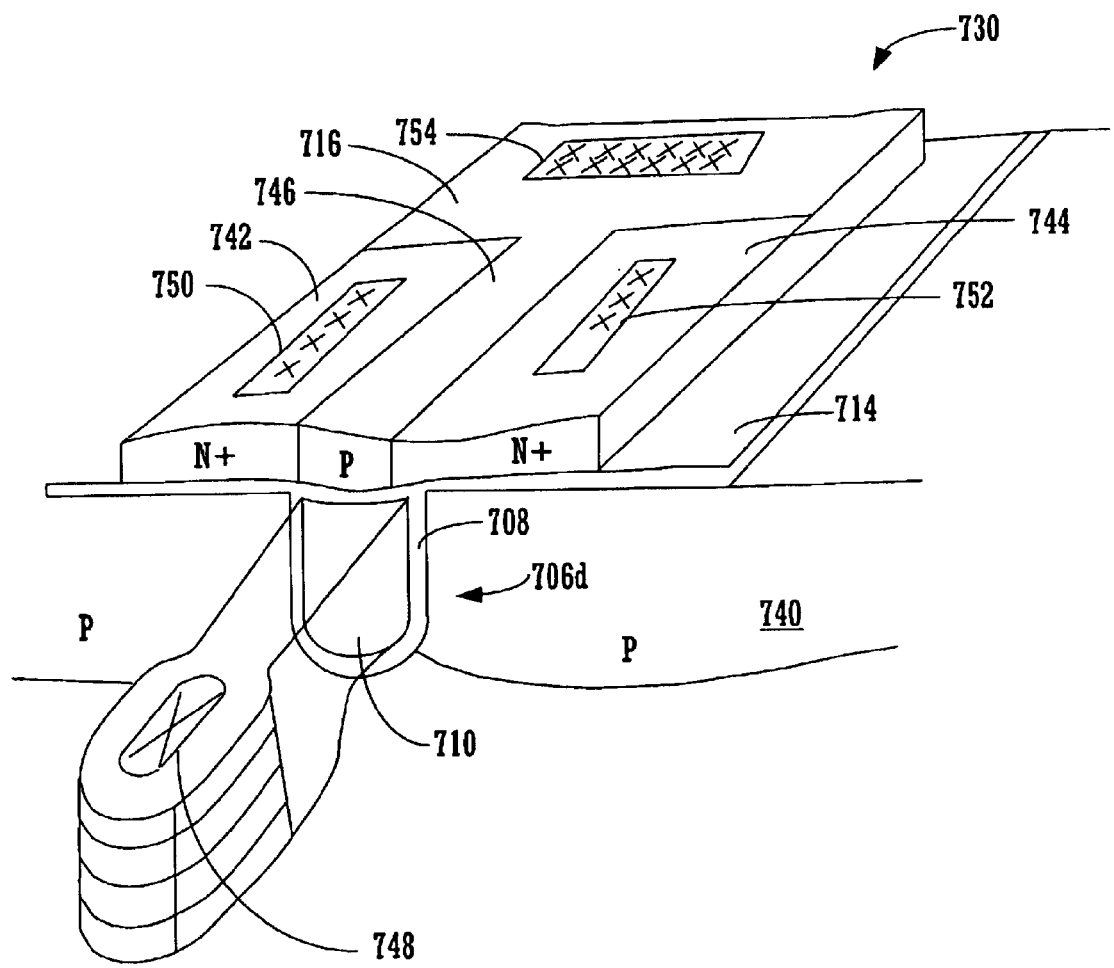
FIG. 27A shows a polysilicon MOSFET that can be fabricated using the process shown in FIGS. 24A–24I.
Figure 27B:
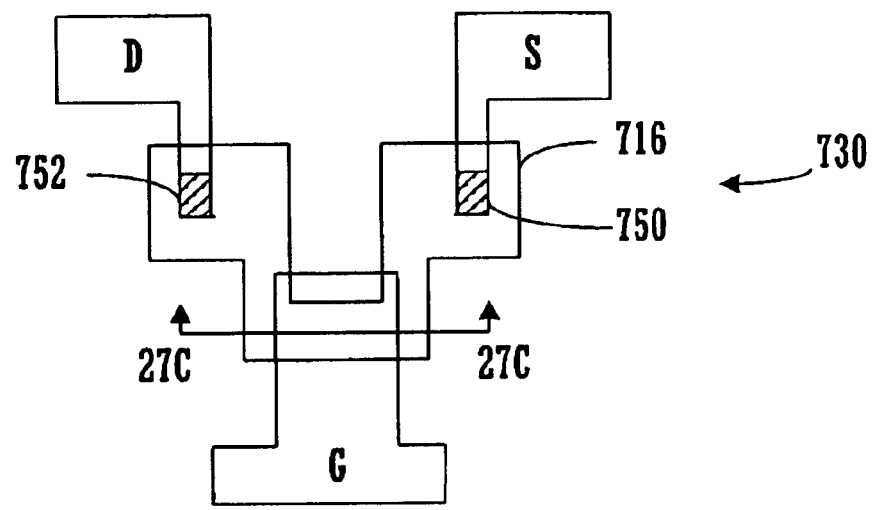
FIGS. 27B and 27C show top and cross-sectional views, respectively, for a particular embodiment of a polysilicon MOSFET.
Figure 27C:
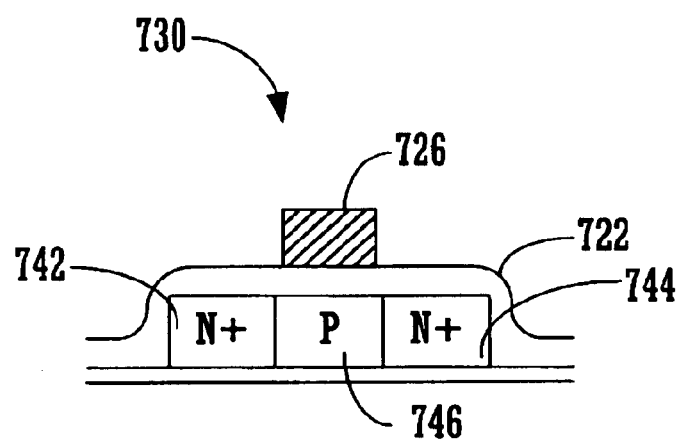

The process described in FIGS. 24A–24I can also be used to fabricate a polysilicon MOSFET 730, shown in FIGS. 27A–27C. A trench 706D is etched through the mask E1. Gate oxide layer 708 is grown and polysilicon layer 710 is deposited as described above (see FIG. 24B). Mask E2 is deposited and P-type dopant is implanted through openings in mask E2 to form a P-type region 740 in N-epi layer 702. Then, after mask E2 is removed, LTO layer 714 is deposited over the surface of layer 702, and the second polysilicon layer 716 is deposited over LTO layer 714 (see FIG. 24D). A blanket P-type implant of polysilicon layer 716 is performed.

Polysilicon MOSFET 730 can be formed in numerous geographies. For example, the source/drain regions may be interdigitated as shown in the top view of FIG. 27B. FIG. 27C is a cross-sectional view of the structure shown in FIG. 27B taken at section 27C–27C.

Mask E3 is used to pattern polysilicon layer 716 and LTO layer 714 as shown in FIG. 27A. At the same time mask E3 is used to form an opening through polysilicon layer 716 and LTO layer 714 to a gate contact region 748 on polysilicon layer 710. After mask E3 has been removed, mask E4 is deposited and patterned such that the subsequent implantation of N-type dopant through openings in mask E4 forms an N+ source region 742 and an N+ drain region 744 in polysilicon layer 716. N+ regions 742 and 744 are formed at the same time as the cathode of diode 720 (see FIG. 24E). Source region 742 and drain region 744 are separated by a P-body region 746 that is located directly over trench 706D.

BPSG layer 722 is deposited and openings in mask E5 are used to etch through BPSG layer 722 to a source contact 750, a drain contact 752 and a body contact 754. The openings in BPSG layer 722 are filled with metal layer 726, and mask E6 is used to separate metal layer 726 into source, drain, body and gate segments (not shown). In many embodiments the source and body segments of metal layer 726 are shorted together or are part of a single source-body segment of metal layer 726.

Another variation of the process can be used to fabricate a MOSFET by growing the body region of the device epitaxially. This process is shown in FIGS. 25A–25F.

Figure 25A:
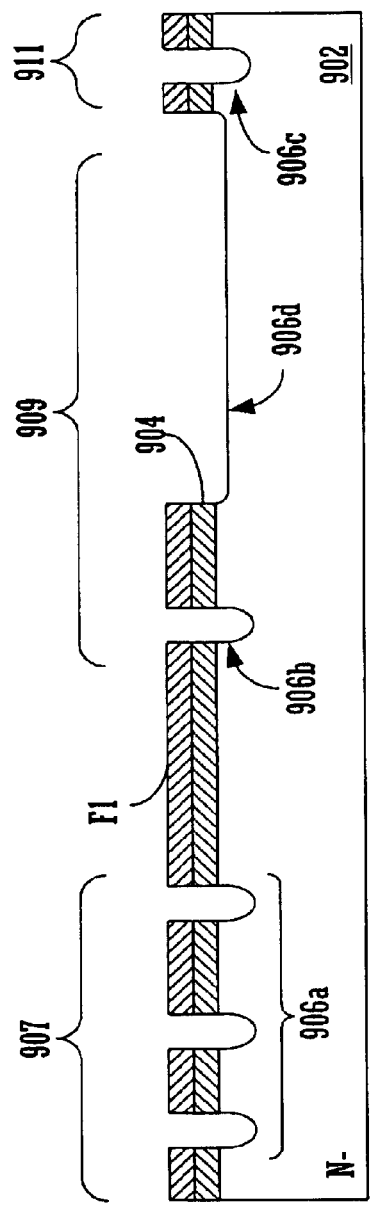
FIGS. 25A–25F illustrate the steps of a process in accordance with this invention for fabricating a MOSFET by growing the body region epitaxially.
Figure 25B:
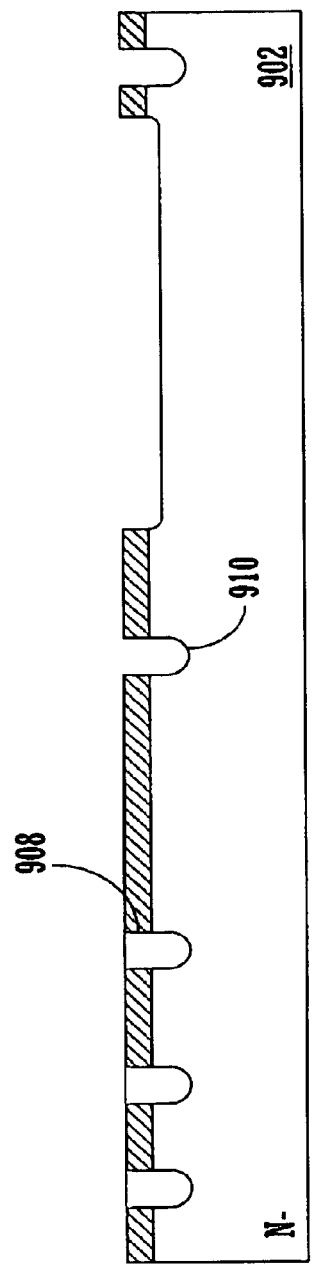

Initially, a P-type epitaxial (epi) layer 904 is grown on the surface of an N-type layer 902. A first mask F1 is then deposited on the surface of epi layer 904 and patterned. Trenches 906 are etched through openings in mask F1, with trenches 906A in an active region 907, trench 906B in a termination region 909, trench 906C in a channel stopper region 911, and a wide trench 906D in termination region 909 (FIG. 25A). A sacrificial oxide layer (not shown) is grown on the walls of the trenches 906 to repair crystal damage caused by the etching. The sacrificial oxide layer is removed, and a gate oxide layer 908 is grown on the walls of the trenches 906. A polysilicon layer 910 is then deposited over the surface of the device, doped and etched back so that it remains in the trenches 906A, 906B and 906C (FIG. 25B). Because trench 906D is very wide, polysilicon layer 910 is removed from trench 906D.

Figure 25C:
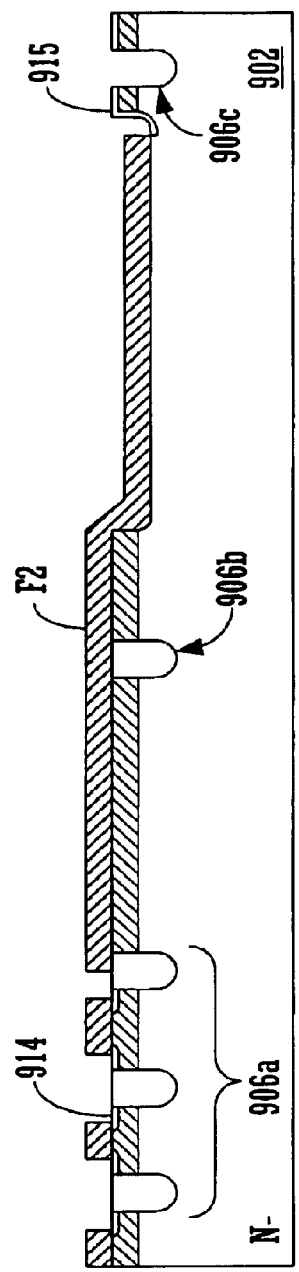

A second mask F2 is deposited and patterned and N-type dopant is implanted through openings in mask F2 to form N+ source regions 914 and an N+ region 915 around trench 906C (FIG. 25C). Mask F2 is removed.

Figure 25D:
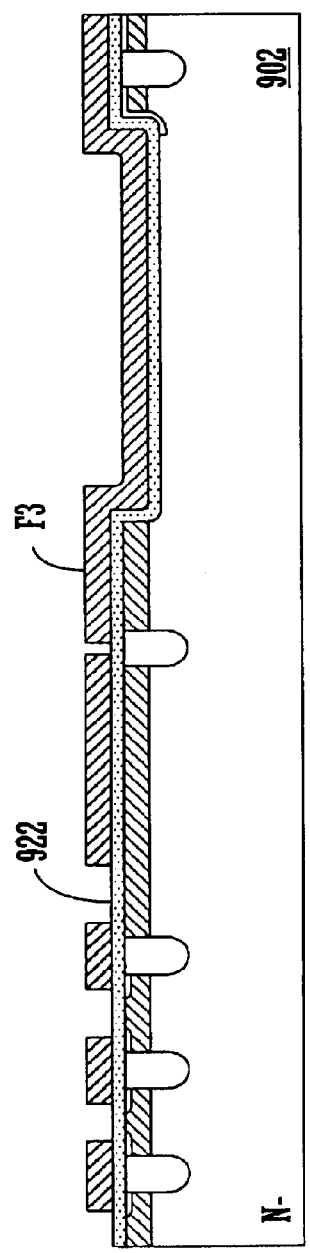
Figure 25E:
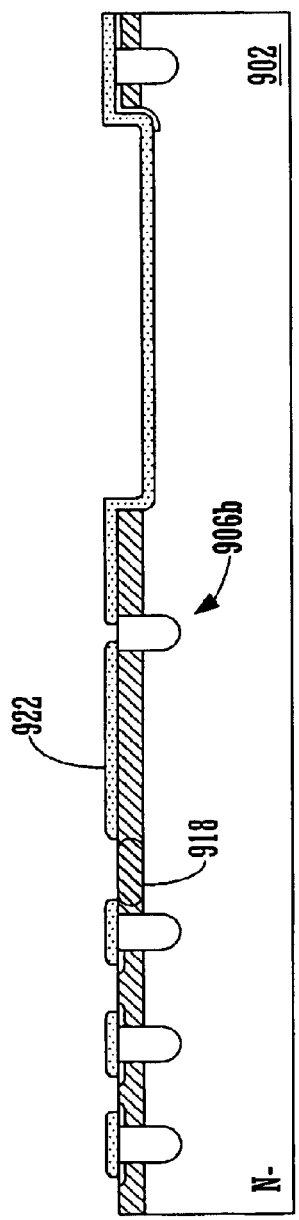

A BPSG layer 922 is deposited, and a third mask F3 is deposited over BPSG layer 922 and patterned (FIG. 25D). BPSG layer 922 is etched through mask F3, and mask F3 is removed. P-type dopant is implanted to form P+ contact regions 918 (FIG. 25E). The doping concentration of the P-type dopant is not high enough to significantly affect the doping of polysilicon layer 910 in trench 906B.

Figure 25F:
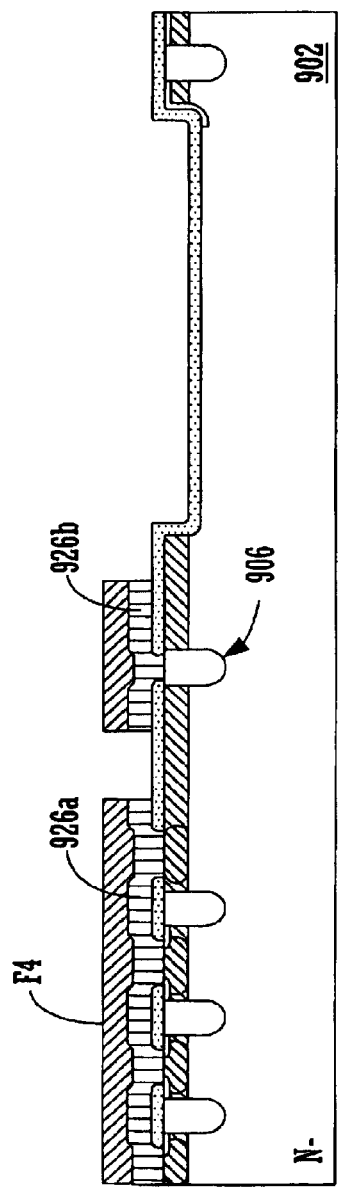

A metal layer 926 is deposited and a fourth mask F4 is deposited over metal layer 926 and patterned. Metal layer 926 is etched through openings in mask F4 to separate metal layer 926 in to a portion 926A that contacts the source-body regions of the MOSFETs and a portion 926B that contacts the polysilicon in trench 906A (FIG. 25F). Mask F4 is then removed.

There are several advantages to this process. The number of masks required is further reduced to only four. It is a low thermal budget process, since the P-type body dopant, being grown epitaxially rather than implanted, does not need to be activated and driven in. This is of great benefit in the manufacture of shallow trench, low threshold voltage, and P-channel devices. (Of course, the body dopant would be N-type for P-channel devices.) Since the temperature does not have to exceed about 900° C. after the trenches are filled, materials such as tungsten and titanium silicide can be used in place of polysilicon to fill the trenches. The process can be adapted as shown in FIGS. 24A–24I to fabricate polysilicon diodes and MOSFETs in the same device.

Figure 26A:
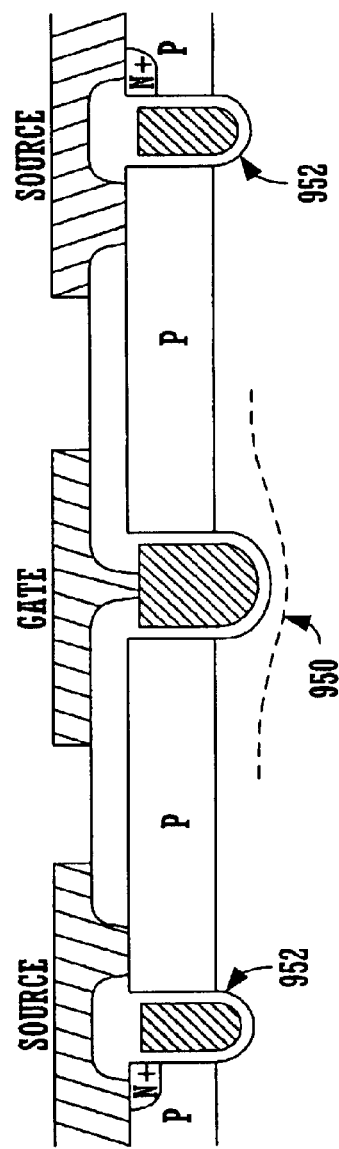
FIG. 26A shows a cross-sectional view of a conventional gate contact trench.
Figure 26B:
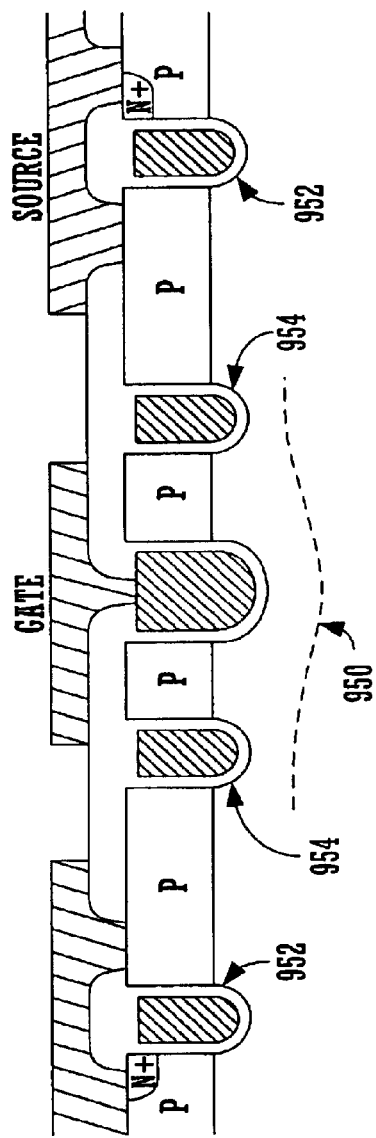
FIG. 26B shows a cross-sectional view of a gate contact trench and a pair of protective trenches in accordance with the invention.

It may be desirable to make the gate contact trench wider than the trenches in the active area of the device, as shown in FIGS. 15–19. When this is done, unless special precautions are taken in the etching process, the gate contact trench will also be deeper than the trenches in the active area. This is illustrated in FIG. 26A, which shows a gate contact trench 950 positioned between two MOSFET trenches 952. The increased depth of trench 950 would be of no consequence if the bottom of the trench were covered or shielded by a deep diffusion of the same polarity as the body. Absent such a deep diffusion, however, the breakdown voltage will be lower under gate contact trench 950 than under active MOSFET trenches 952. The potential contours, represented by the dashed line in FIG. 25A, are curved under trench 950, indicating that the breakdown voltage is less in that location than under trenches 952.

This problem can be alleviated or overcome by placing shielding trenches on the opposite sides of trench 950, as illustrated by shielding trenches 954 in FIG. 25B. Shielding trenches 954 can be the same size as active MOSFET trenches 952, but this need not be the case. Shielding trenches 954 should be positioned close to gate contact trench 950. Preferably the spacing between shielding trenches 954 and gate contact trench 950 is less than the thickness of the N-epi layer, e.g., the same as the width of the mesas between the trenches in the active area of the device. The mesas between shielding trenches 954 and gate contact trench 950 may be allowed to float. In some cases, it may be desirable to form two or more shielding trenches on each side of the gate contact trench. The shielding trenches improve the breakdown of the gate contact trench because the limited charge available between the shielding trenches and the gate contact trench flattens out the potential contours, as shown by the dashed line in FIG. 25B.

It will be understood by those skilled in the art that the broad principles of this invention can be used to fabricate many embodiments in addition to those specifically described herein. Accordingly, the embodiments described herein are to be regarded as illustrative and not limiting.

We claim:

1. A trench-gated MIS device formed in a semiconductor chip and comprising:

an active area containing transistor cells;

a gate metal area containing no transistor cells; and a gate metal layer, wherein a trench is formed in a pattern on a surface of the semiconductor chip, the trench extending from the active area into the gate metal area, the trench having walls lined with a layer of an insulating material, a conductive gate material being disposed in the trench, a top surface of the conductive gate material being at a level below a top surface of the semiconductor chip, a nonconductive layer overlaying the active and gate metal areas, an aperture being formed in the nonconductive layer over a portion of the trench in the gate metal area, the aperture being filled with a gate metal such that the gate metal contacts the gate material in an area of contact within the trench and wherein a first gate finger extends from the active area to the gate metal area. the area of contact between the gate contact material and the conductive gate material being located in a second gate finger, the second gate finger being perpendicular to the first gate finger.

2. The trench-gated MIS device of claim 1 comprising a gate metal layer overlying the nonconductive layer in the gate metal area, the gate metal layer being in electrical contact with the gate material.

3. The trench-gated MIS device of claim 2 wherein the gate metal layer extends longitudinally in a direction perpendicular to a direction of the trench in the gate metal area.

4. The trench-gated device of claim 1 wherein a width of the second gate finger is the same as a width of the first gate finger at an intersection between the first and second gate fingers.

5. A trench-gated MIS device formed in a semiconductor chip and comprising:

an active area containing transistor cells;

a gate metal area containing no transistor cells;

a first and a second gate finger extending from the active area to the gate metal area; and a gate metal layer, wherein a trench is formed in a pattern on a surface of the semiconductor chip, the trench extending from the active area into the gate metal area, the trench having walls lined with a layer of an insulating material, a conductive gate material being disposed in the trench, a top surface of the conductive gate material being at a level below a top surface of the semiconductor chip, a nonconductive layer overlaying the active and gate metal areas, an aperture being formed in the nonconductive layer over a portion of the trench in the gate metal area, the aperture being filled with a gate metal such that the gate metal contacts the gate material in an area of contact within the trench.

6. The trench-gated MIS device of claim 5 comprising a gate metal layer overlying the nonconductive layer in the gate metal area, the gate metal layer being in electrical contact with the gate material.

7. The trench-gated MIS device of claim 6 wherein the gate metal layer extends longitudinally in a direction perpendicular to a direction of the trench in the gate metal area.

* * * * *